(12) United States Patent
Schuderer et al.

(10) Patent No.: US 8,163,629 B2
(45) Date of Patent: Apr. 24, 2012

(54) METALLIZATION FOR CHIP SCALE PACKAGES IN WAFER LEVEL PACKAGING

(75) Inventors: Berthold Schuderer, Regensburg (DE); Carsten Ahrens, Pettendorf (DE)

(73) Assignee: Infineon Technologies AG, Neubiberg (DE)

( * ) Notice: Subject to any disclaimer, the term of this patent is extended or adjusted under 35 U.S.C. 154(b) by 7 days.

(21) Appl. No.: 12/851,292

(22) Filed: Aug. 5, 2010

(65) Prior Publication Data
US 2012/0034760 A1    Feb. 9, 2012

(51) Int. Cl.
*H01L 21/301* (2006.01)

(52) U.S. Cl. .................................................... 438/462

(58) Field of Classification Search ............... 438/462
See application file for complete search history.

(56) References Cited

U.S. PATENT DOCUMENTS
2006/0197187 A1    9/2006    Lohninger et al.

*Primary Examiner* — Alexander Ghyka
*Assistant Examiner* — Stanetta Isaac
(74) *Attorney, Agent, or Firm* — Slater & Matsil, L.L.P.

(57) ABSTRACT

In one embodiment, a method for forming the semiconductor device includes forming a first trench from a front side of a substrate. The substrate has a front side and an opposite back side, and the first trench having sidewalls and a bottom surface. A insulator layer is formed over the sidewalls and the bottom surface. A first conductive layer is formed over a top portion of the sidewalls of the first trench. The substrate is separated along the first trench.

32 Claims, 31 Drawing Sheets

METALLIZATION FOR CHIP SCALE PACKAGES IN WAFER LEVEL PACKAGING

TECHNICAL FIELD

The present invention relates generally to chip scale packages, and more particularly to metallization for chip scale packages in wafer level packaging.

BACKGROUND

Packages for single semiconductor elements or semiconductor devices may be wired packages or packages having solder bumps. Discrete semiconductor devices are mainly produced as wired packages and offered in so-called SMD (surface mounted device) packages. A SMD package is mounted directly onto the surface of a circuit board.

In a wired package, a semiconductor chip is applied or mounted to a metallic support (lead) or lead frame, wherein so-called bond wires (connecting wires) connect the contact pads (semiconductor contacts) of the semiconductor chip to the metallic support or lead frame. Thus, supports or lead frames in the application are connected to the associated conductive traces on the circuit board by means of solder in an electrically and/or thermally conducting way. The backside contact of the semiconductor chip here may also form an electrical and/or thermal contact to the lead frame. After connecting the semiconductor chip to the lead frame, the system is encapsulated by a sealing mass (mold), thus producing a package much larger than the actual chip.

Forming low cost chip scale packages is one of the significant challenges in packaging semiconductor devices.

SUMMARY OF THE INVENTION

In accordance with an embodiment, a method for forming the semiconductor device comprises forming a first trench from a front side of a substrate. The substrate has the front side and an opposite back side, and the first trench has sidewalls and a bottom surface. An insulator layer is formed over the sidewalls and the bottom surface of the first trench. A conductive liner is formed over the insulator layer. A bottom portion of the first trench is filled with a fill material. A conductive layer is formed over the exposed conductive liner. The fill material is removed and the substrate is separated along the first trench.

In accordance with an alternative embodiment, a method for forming the semiconductor device comprises forming a first trench from a front side of a substrate. The substrate comprises a front side and an opposite back side, and the first trench having sidewalls and a bottom surface. A insulator layer is formed over the sidewalls and the bottom surface. A first conductive layer is formed over a top portion of the sidewalls of the first trench. The substrate is separated along the first trench.

In accordance with yet another embodiment, a method for forming the semiconductor device comprises forming a first trench in a substrate. The substrate has a front side and an opposite back side, and the first trench has sidewalls and a bottom surface. A insulator layer is formed over the sidewalls and the bottom surface of the first trench. A conductive liner is formed over the insulator layer. A first conductive layer is formed over a top portion of the sidewalls of the first trench. A second trench is formed in the substrate. The second trench extends into the substrate from the bottom surface of the first trench. The second trench has a smaller critical dimension than the first trench. The substrate is separated along the first trench.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1a-1c, illustrates a semiconductor substrate in a stage of processing, in accordance with an embodiment of the invention, wherein FIG. 1a represents a top view and FIG. 1b illustrates a cross sectional view;

FIG. 3, which includes

FIG. 4, which includes FIG. 5, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Wafer level packaging (WLP) has been increasingly favored because of the possibility to decrease the total package size as well as being able to reduce the cost of fabrication. Wafer-level packaging extends wafer fabrication processes to include some of the packaging steps. Most other kinds of packaging first dice the wafers into dies, and then place the die in a housing. In contrast, in WLP, the top and bottom outer layers of packaging including the solder bumps may be formed before dicing. Thus a single operation on the wafer scale saves many separate packaging steps in conventional packaging. However, conventional WLP processing cannot be incorporated for discrete devices that may require special contacts. Embodiments of the invention describe methods to use WLP for forming chip scale packages (CSP). As will be described in detail, various embodiments provide solderable surface for forming contacts without forming a short between the contact and the silicon bulk or between the contact and adjacent contacts.

Figure 1A:
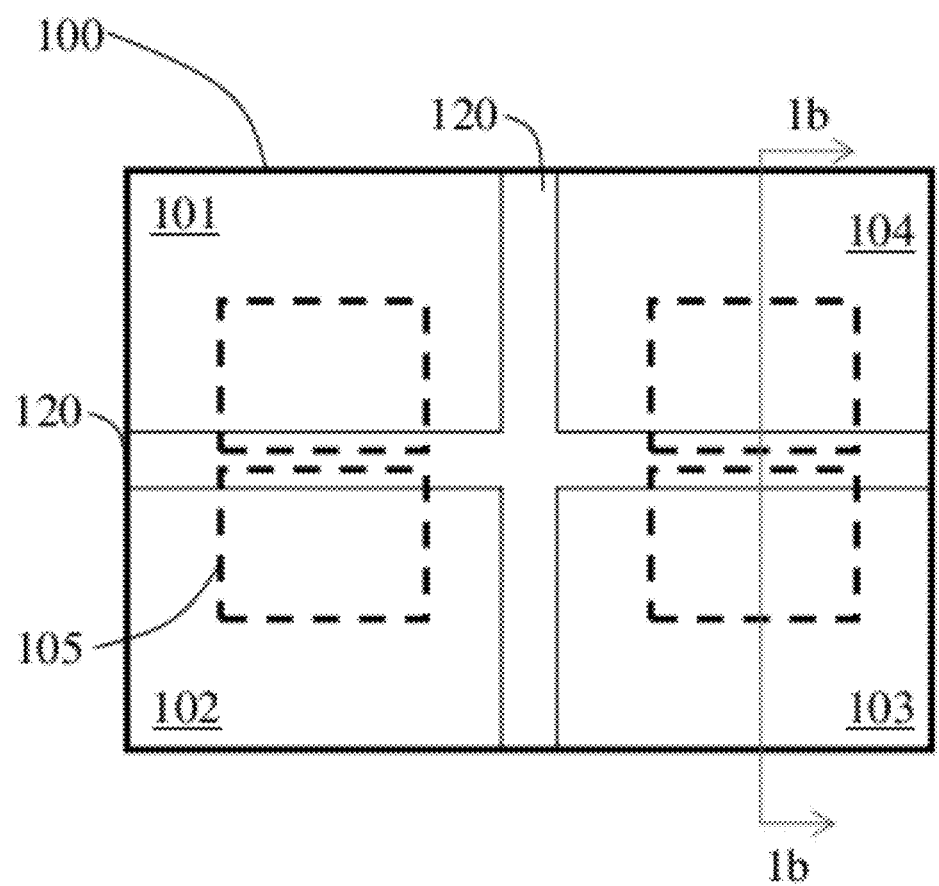
Figure 1B:
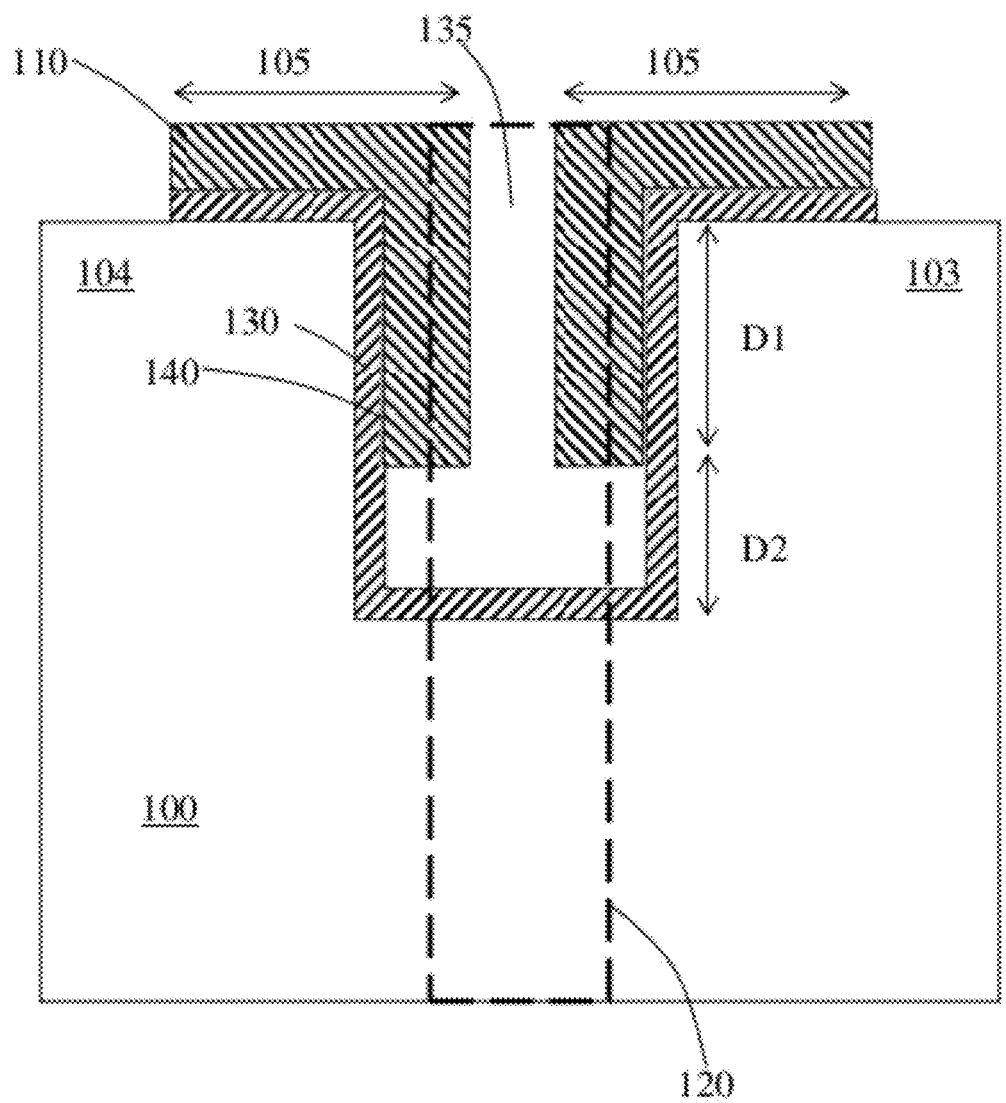
Figure 1C:
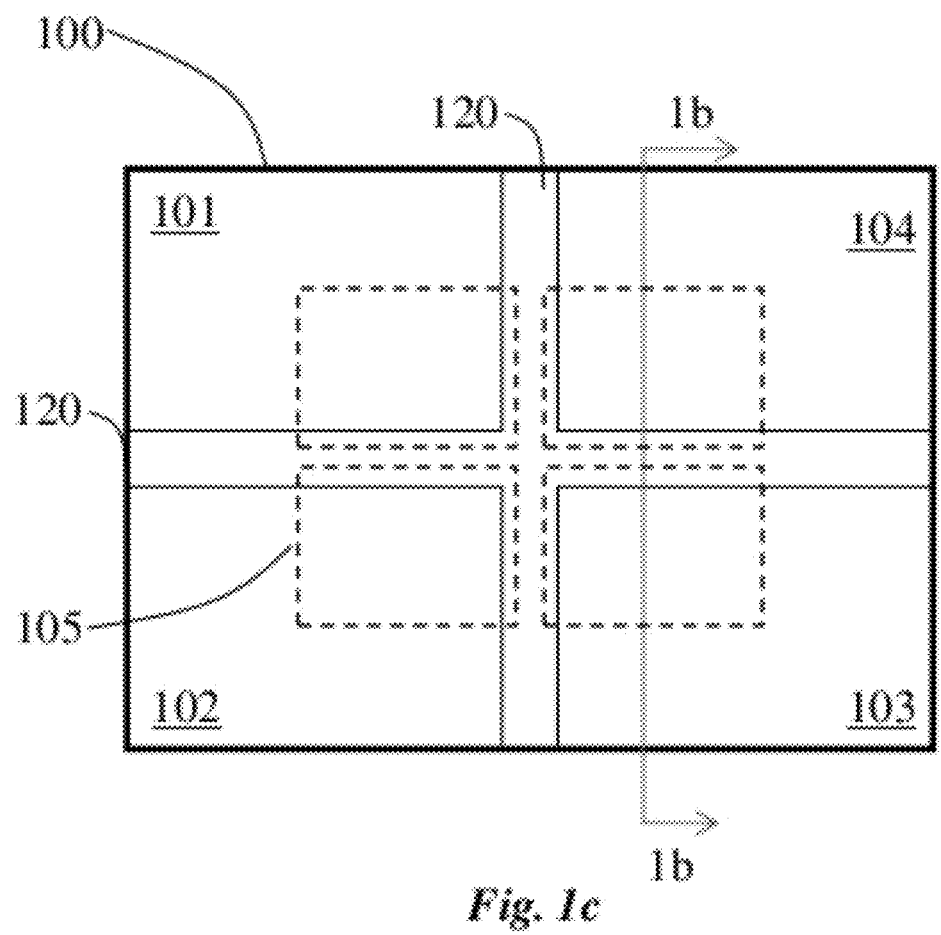

FIG. 1, which includes FIGS. 1a-1c, illustrates a semiconductor substrate in a stage of processing, in accordance with an embodiment of the invention, wherein FIGS. 1a and 1c represent top view and FIG. 1b illustrates a cross sectional view.

FIG. 1 illustrates a substrate 100 before wafer dicing. Therefore, the substrate 100 comprises a wafer such as a semiconductor wafer, a semiconductor on insulator wafer. The semiconductor may be silicon, germanium, silicon carbon, or compound semiconductors.

Referring to FIG. 1a, a substrate 100 comprises first, second, third, and fourth chips 101, 102, 103, and 104. The first, the second, the third, and the fourth chips 101, 102, 103, and 104 are separated by dicing streets 120. Dicing streets represent regions between chips used during separation of the wafer into individual chips. Dicing streets are also known as kerf.

Referring to FIG. 1a, each chip comprises contact pad 105. The contact pad 105 may be used by external circuitry to contact the chips. For example, the chips may be soldered to circuit boards (not shown). In various embodiments, each chip includes a plurality of contacts, although only one contact pad is shown as an example. As illustrated in a top view of FIG. 1a, the contact pads 105 are adjacent and overlap the dicing street 120.

Referring to FIG. 1b, the contact pads 105 provide a contact to the substrate 100 (not shown). The contact pads 105 comprise a first metal layer 110. A trench 135 is disposed in the substrate 100. The trench 135 is about 1 µm to about 50 µm in width, and about 15 µm in one embodiment. In various embodiments, the depth of the trench 135 is about 10 µm to about 500 µm, and about 100 µm in one embodiment.

An insulating layer 130 is disposed on the sidewalls and the bottom surface of the trench 135 as illustrated in FIG. 1b. The insulating layer 130 comprises an oxide or a nitride in one embodiment. In various embodiments, the insulating layer 130 is about 2 µm to about 20 µm in thickness, and about 10 µm in one embodiment.

A conductive liner 140 is disposed conformally over the insulating layer 130. In various embodiments, the conductive liner 140 is a seed layer for subsequent metal layers. In one embodiment, the conductive liner 140 comprises copper. In another embodiment, the conductive liner 140 comprises tungsten. In various embodiments, conductive liner 140 comprises a single layer of Ta, TaN, WN, WSi, TiN, and/or Ru as examples. In various embodiments, the conductive liner 140 is used as a barrier layer for preventing, metal from diffusing into the underlying insulating layer 130 and/or substrate 100.

A first conductive layer 110 is disposed over the insulating layer 130. The first conductive layer 110 covers only a portion of the sidewall formed by the insulating layer 130, as illustrated in FIG. 1b by first trench depth D1. The first conductive layer 110 is not disposed over a bottom portion of the trench 135, as illustrated in FIG. 1b by second trench depth D2. Thus, at least a part of the insulating layer 130 is not covered with any conductive layer. As will be described further, the absence of the first conductive layer 110 mitigates undesirable shorting of the contacts.

In one or more embodiments, the first conductive layer 110 comprises copper. In alternative embodiment, the first conductive layer 110 comprises aluminum, tantalum, ruthenium, platinum, nickel, silver, gold, tungsten, tin, lead, or combinations thereof. If the first conductive layer 110 comprises tungsten, a bi-layer seed layer comprising CVD titanium nitride and silicon doped tungsten may be used. In some embodiments, the first conductive layer 110 may comprise doped poly-silicon or silicides. In various embodiments, the first conductive layer 110 may comprise a material that may be soldered or may be a seed or adhesion layer for metal layers that are solderable.

In various embodiments described herein (FIGS. 1-5), the contact pads 105 of FIG. 1 are illustrated as being over a single sidewall of the chip. However, in various embodiments, the contact pads 105 may be disposed along corners of individual chips and therefore cover two perpendicularly oriented sidewalls of the chips (FIG. 1c). In such embodiments, the following descriptions and figures while showing only a single sidewall apply to both the abutting sidewalls. For example, in such embodiments, the first metal layer 110 is disposed on adjacent perpendicular sidewalls of the perpendicular trenches 135.

Figure 2A:
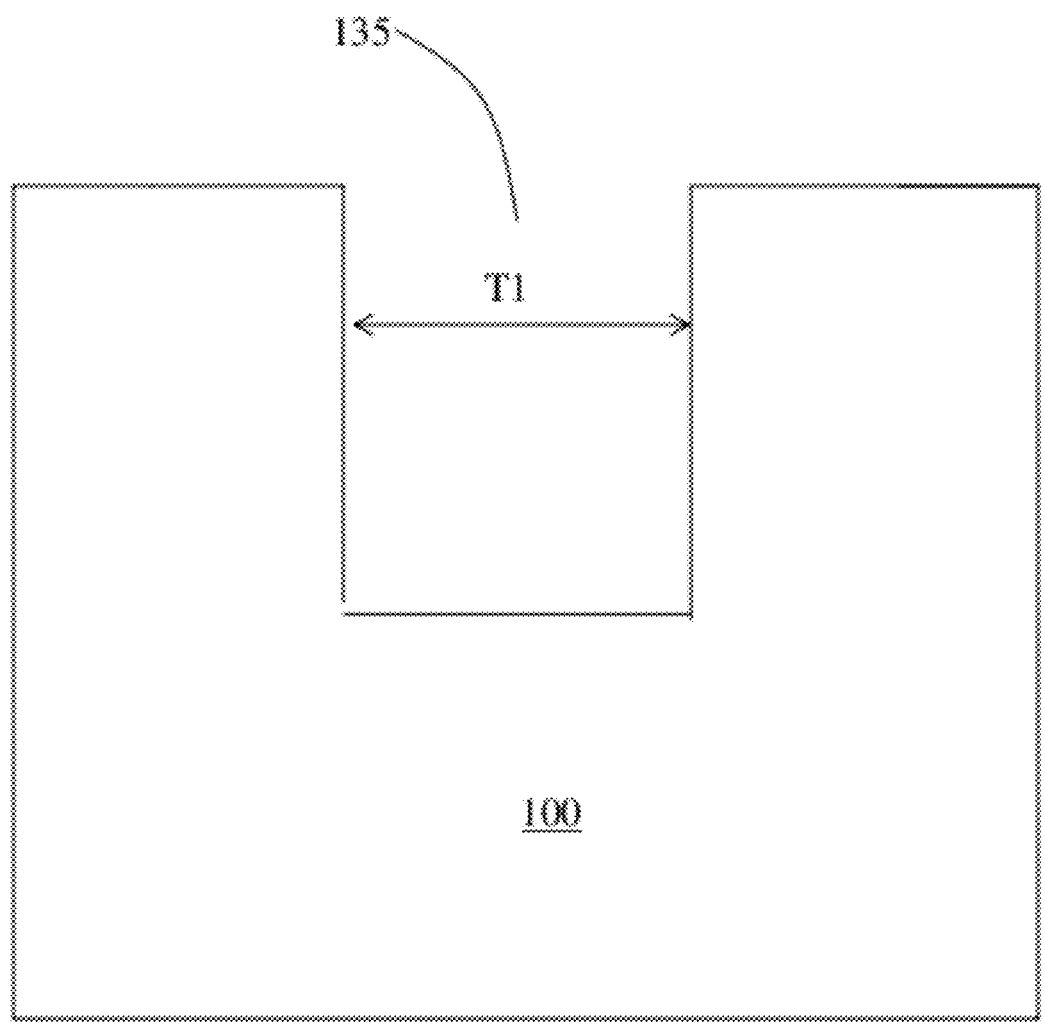
FIGS. 2a-2n, illustrates a semiconductor device in various stages of processing in accordance with an embodiment of the invention.
Figure 2B:
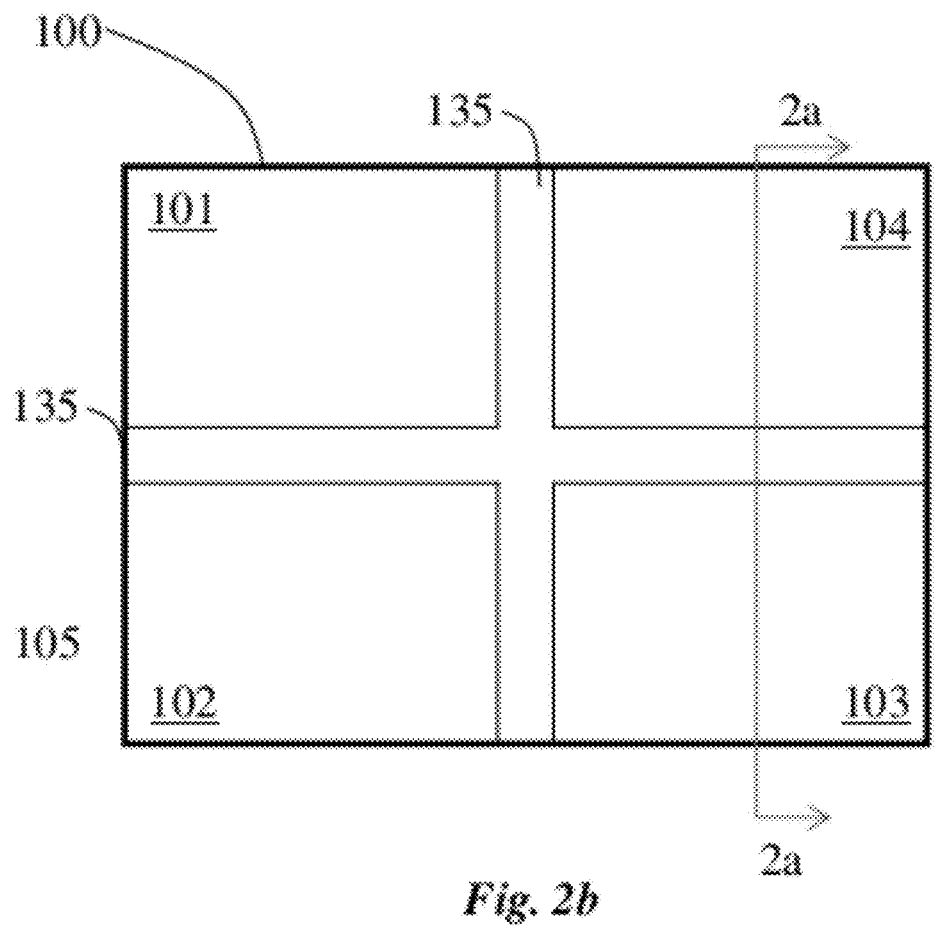
FIG. 2, which includes
Figure 2C:
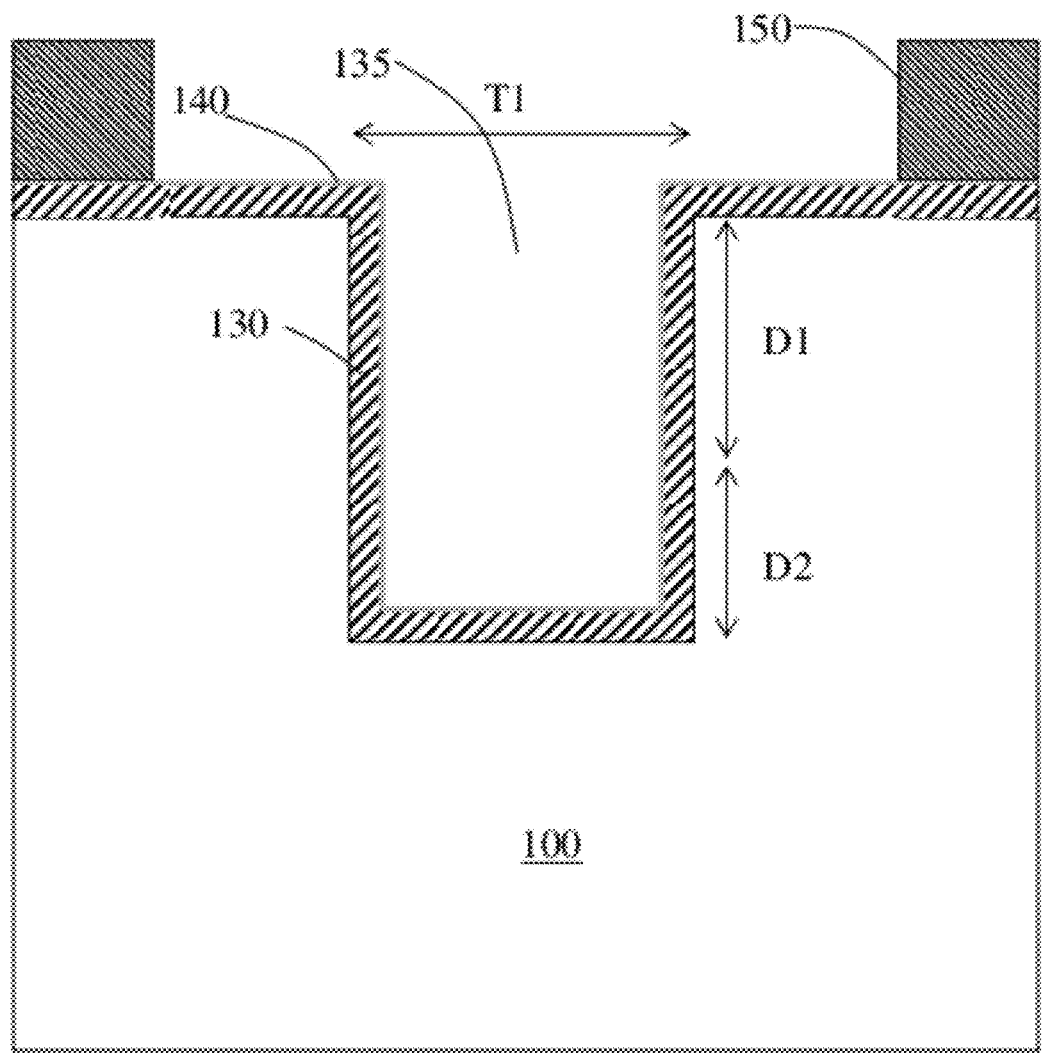
Figure 2D:
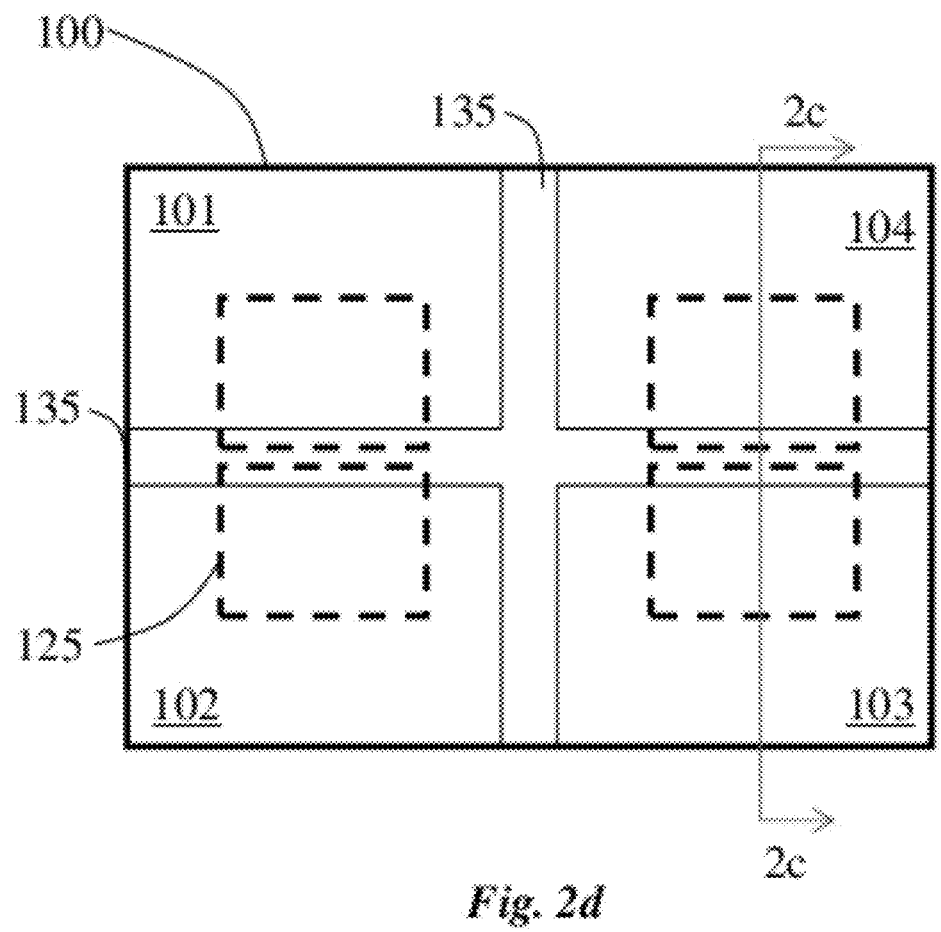
Figure 2E:
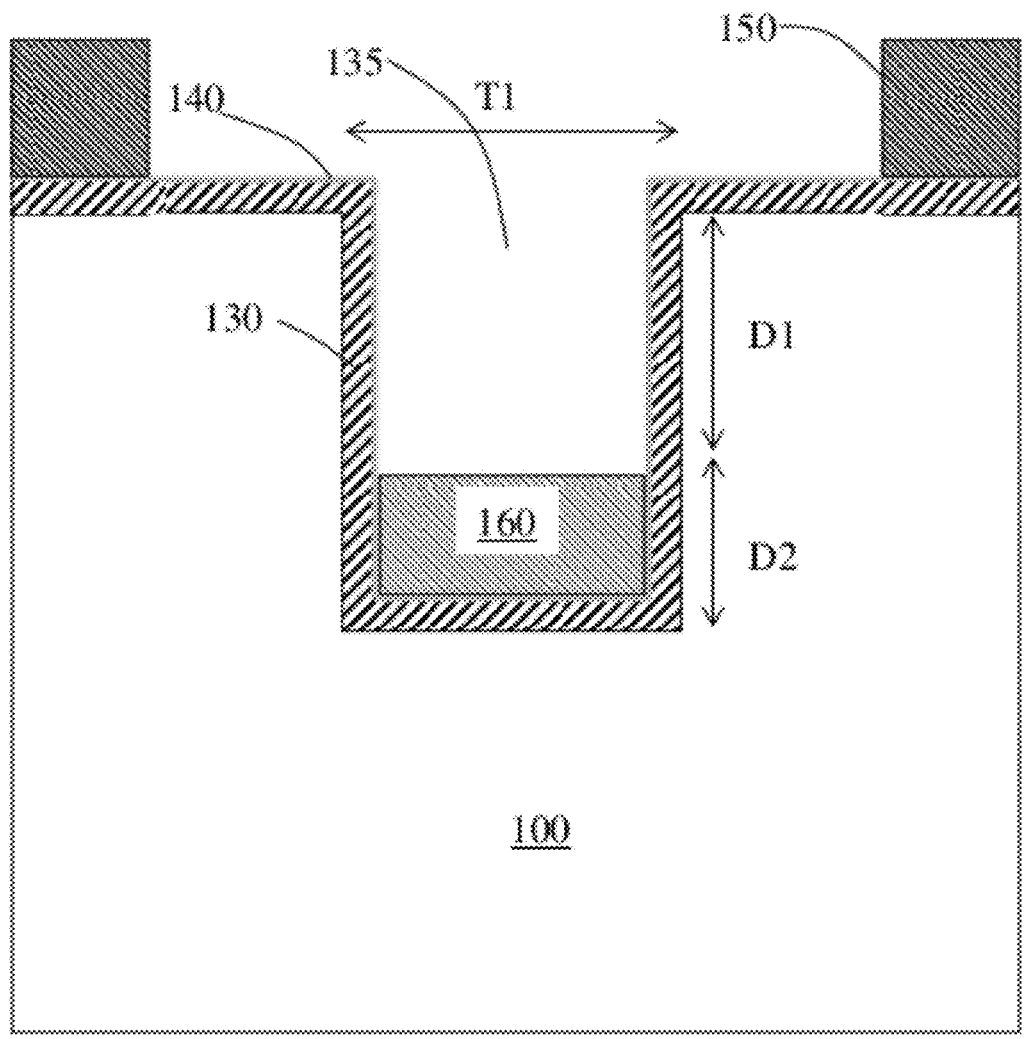
Figure 2F:
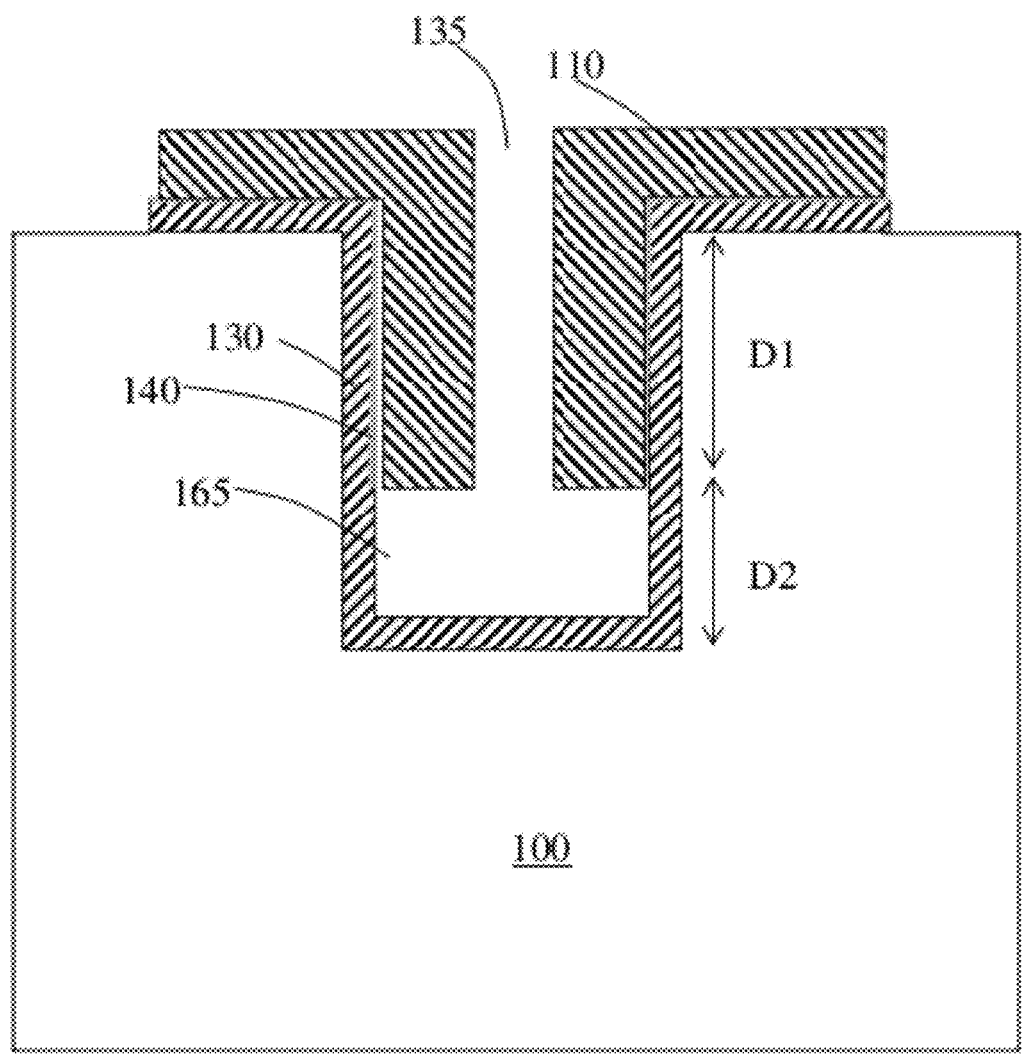
Figure 2G:
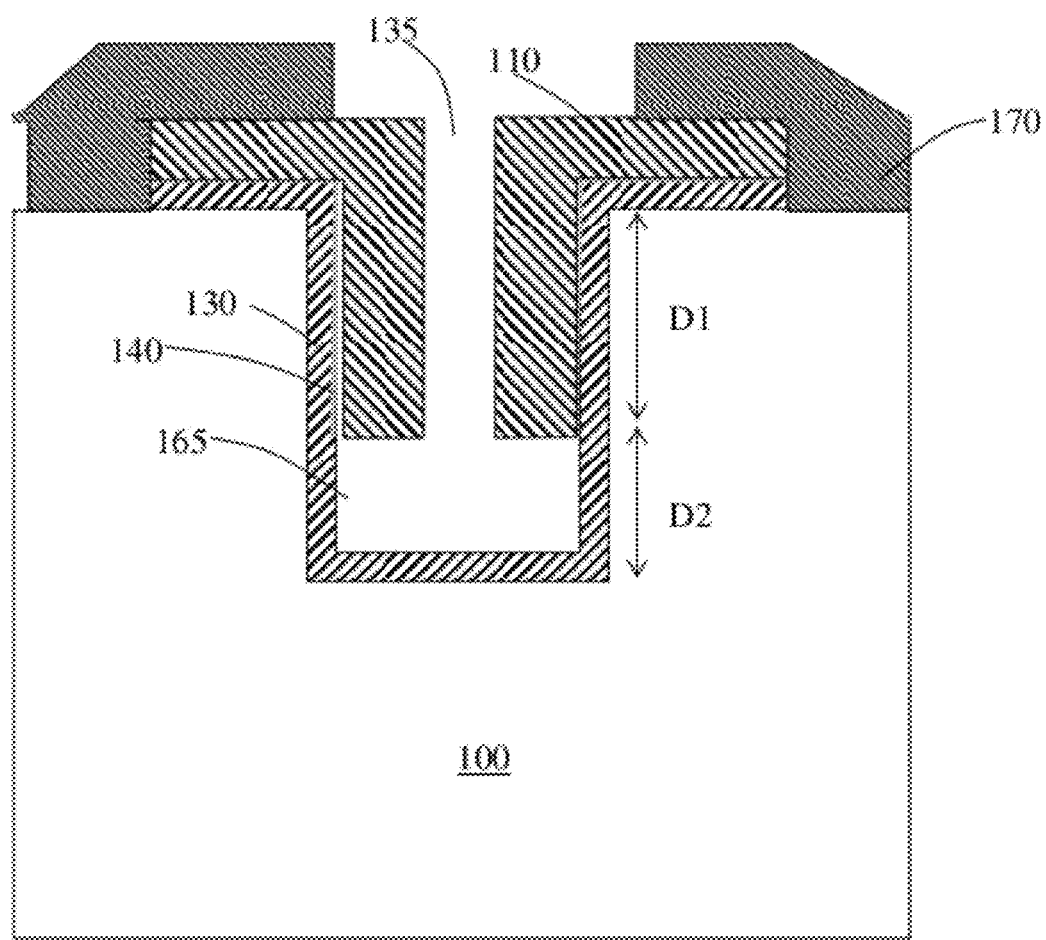
Figure 2H:
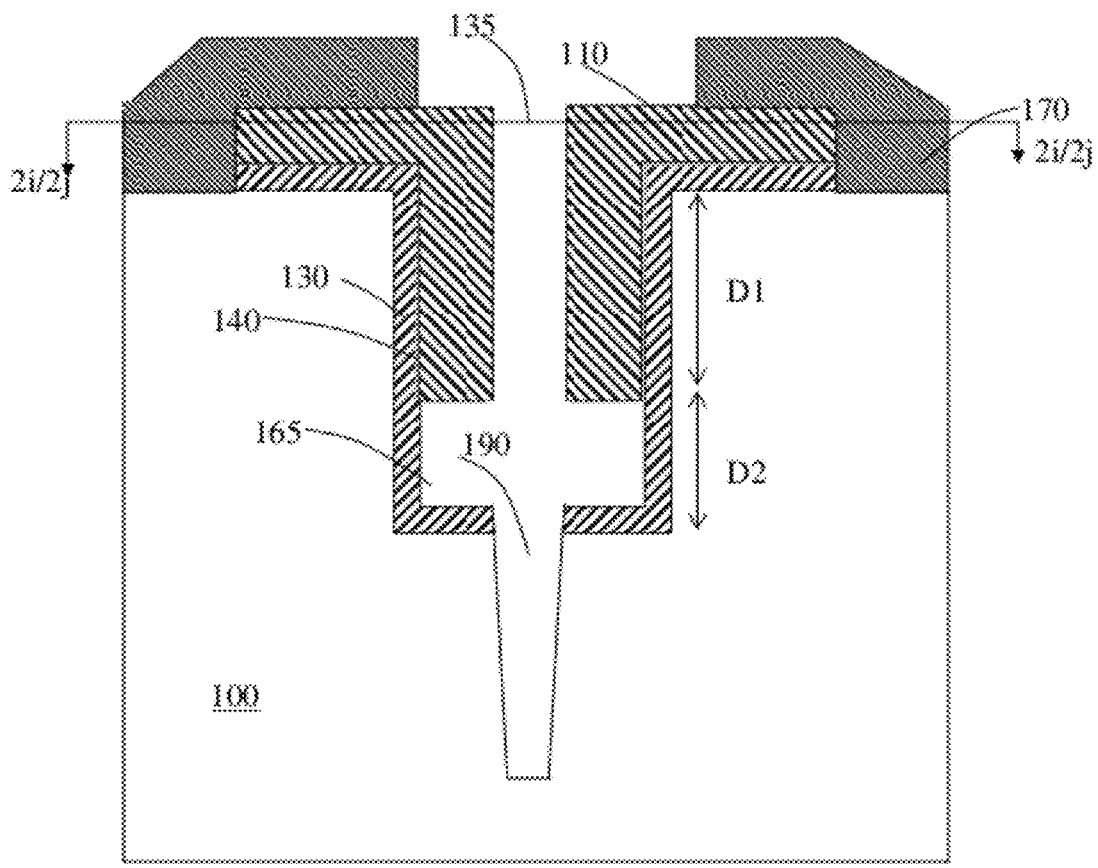
Figure 2I:
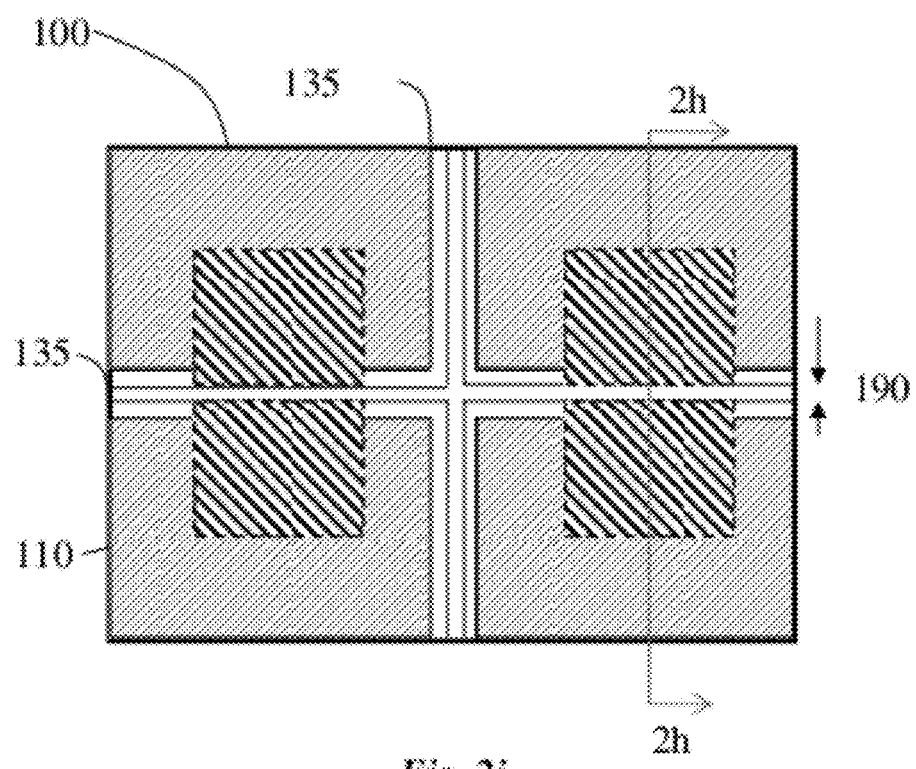
Figure 2J:
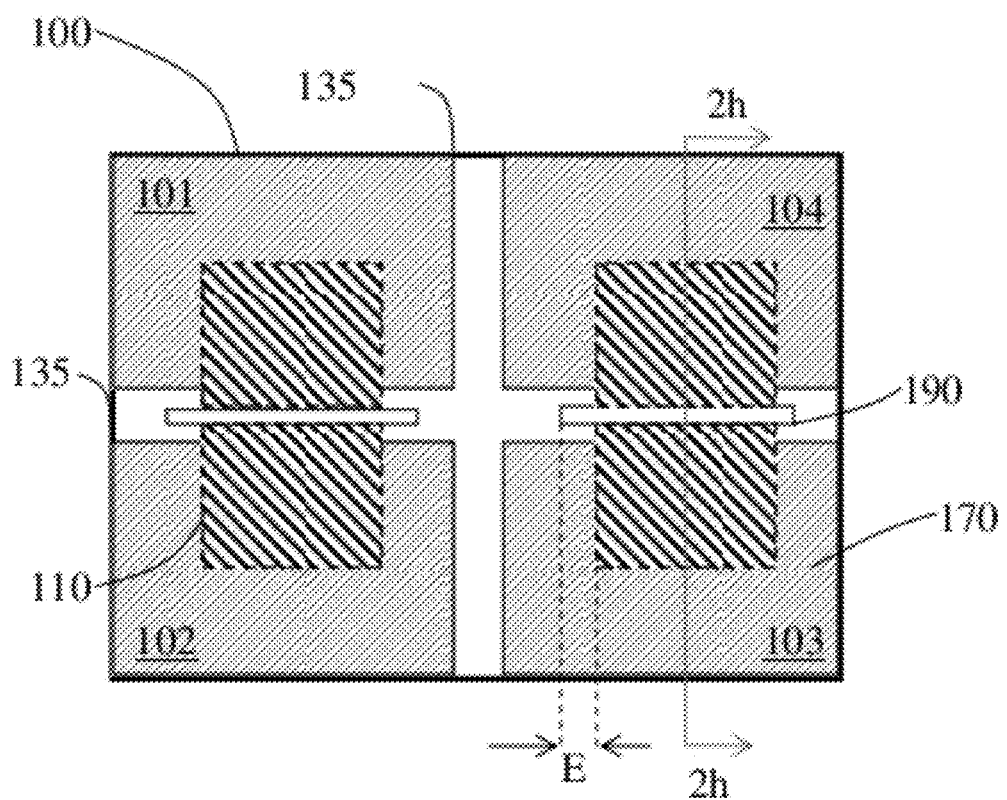
Figure 2K:
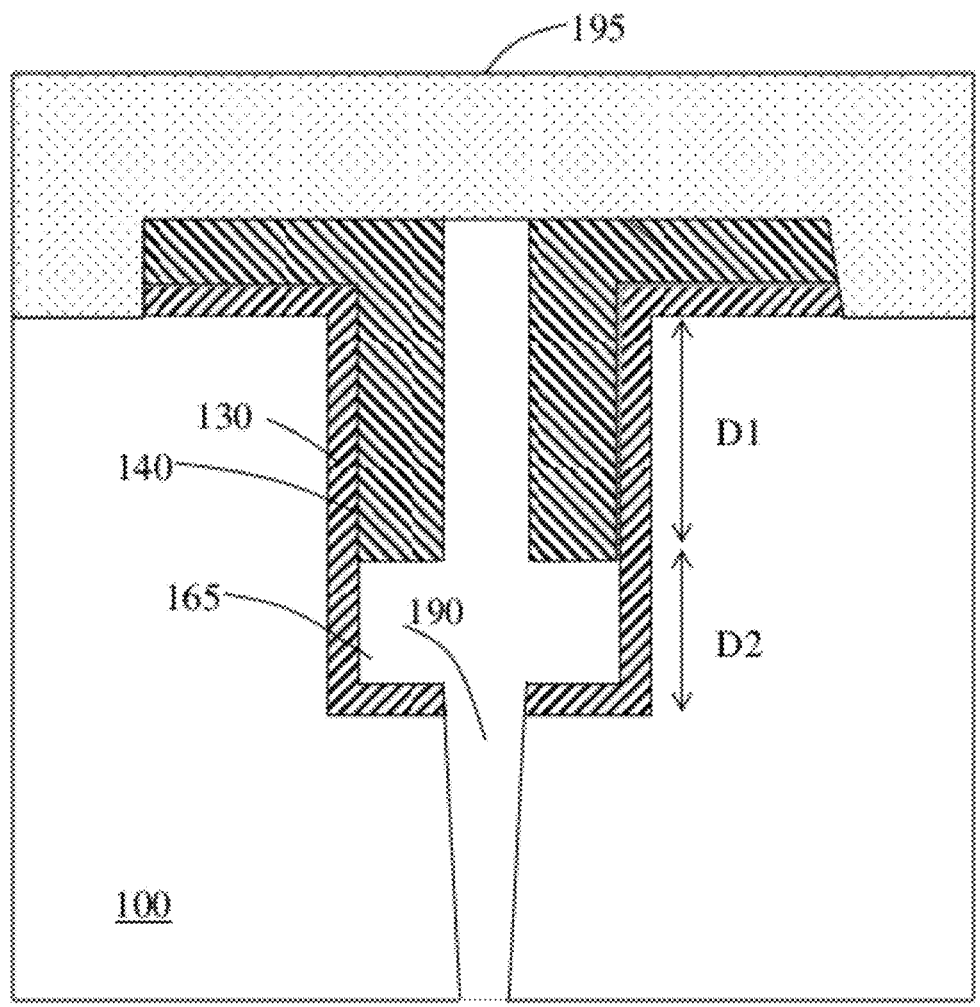
Figure 21:
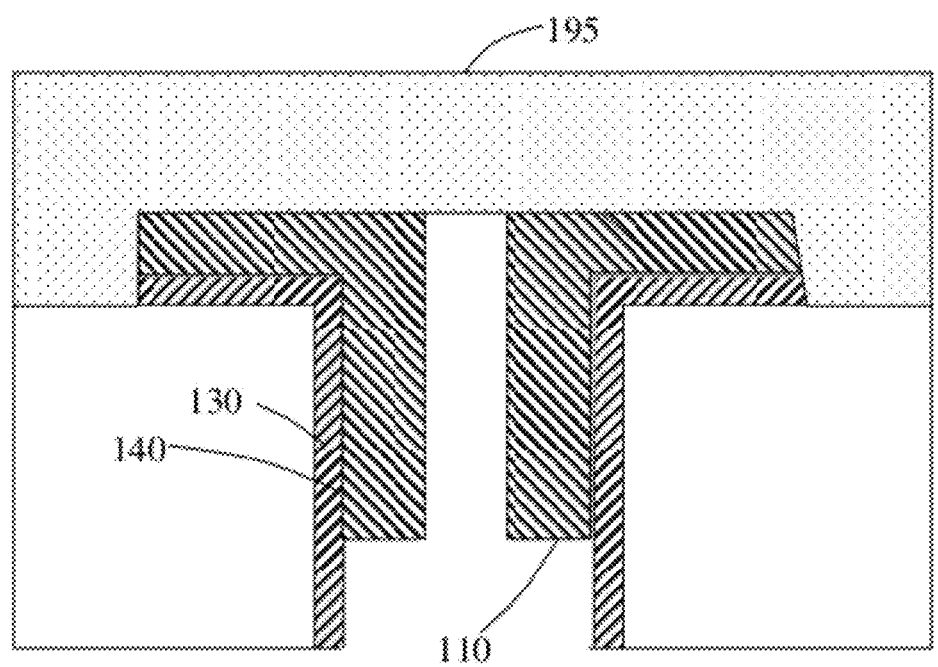
Figure 2M:
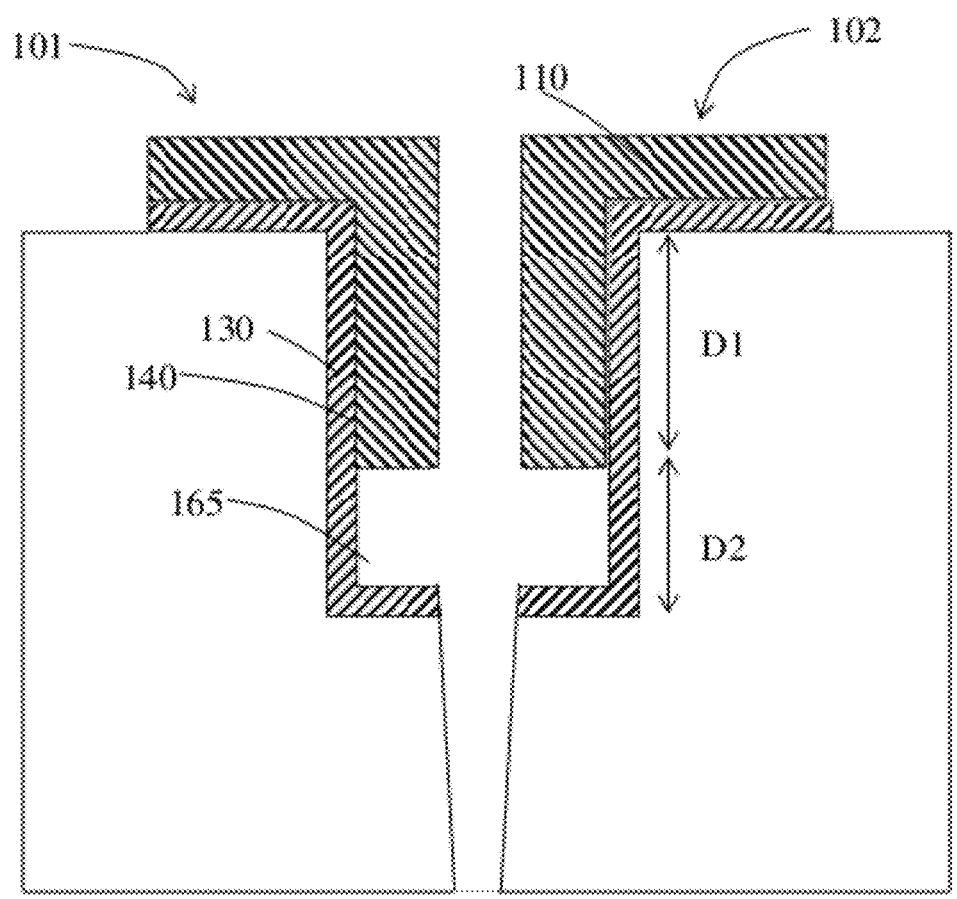
Figure 2N:
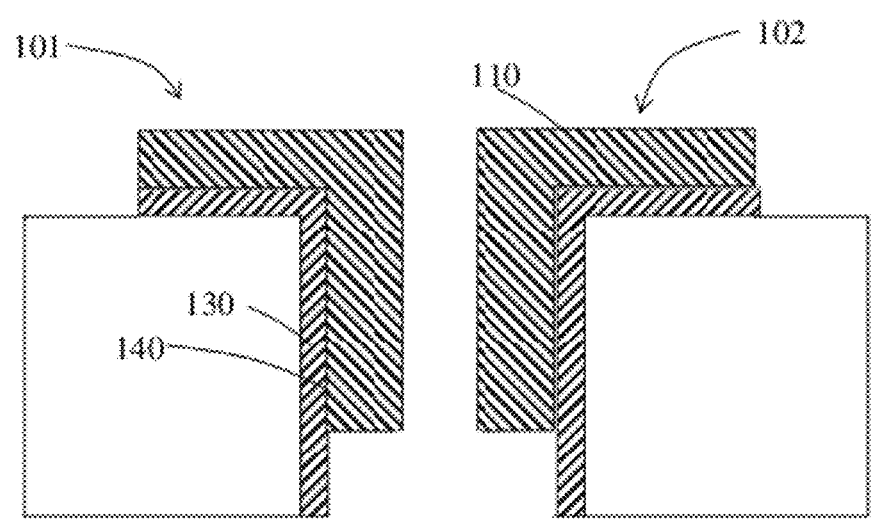

FIG. 2, which includes FIGS. 2a-2n, illustrates a semiconductor device in various stages of processing in accordance with an embodiment of the invention.

Referring to FIG. 2a, device regions are formed near a top surface of a substrate 100 during front end processing. The substrate 100 is typically a semiconductor wafer. The device regions, or active circuitry, can include transistors, resistors, capacitors, inductors or other components used to form integrated circuits. Next, metallization is formed over the device regions to electrically contact and interconnect the device regions. The metallization and active circuitry together form a completed functional integrated circuit. In other words, the electrical functions of the chip can be performed by the interconnected active circuitry. The metallization may include more than one metal level.

After forming all the necessary metal levels, the top metal level or top metallization layer is formed as described further below.

As illustrated in FIG. 2a, a trench 135 having a width T1 is formed with a substrate 100. The width of the trench T1 may be chosen based on the dimension of the dicing street 120 in one embodiment.

The depth of the trench 135 is chosen based on the depth of the active region in one embodiment. In various embodiments, width T1 of the trench 135 is about 1 µm to about 50 µm, and about 15 µm in one embodiment.

In various embodiments, the depth of the trench 135 is deeper than the depth of the active region in the substrate 100. In one embodiment, the depth of the trench 135 is at least 20% deeper than a depth of the active region in the substrate 100. In various embodiments, the depth of the trench 135 is about 10 µm to about 500 µm, and about 100 µm in one embodiment.

In various embodiments, the trench 135 is formed using reactive ion etching. In one or more embodiments, the trench 135 may be formed by depositing a hard mask (not shown) over the substrate 100 and patterning the hard mask using a lithography process. For example, a photo resist may be coated over the hard mask and exposed using a lithography mask. After developing the photo resist, the hard mask is patterned. Using the patterned hard mask as an etch mask, the substrate 100 is exposed to a reactive ion etch process that forms the trench 135. The hard mask is removed immediately or later during subsequent processing.

In various embodiments, the trench 135 is formed along the dicing streets 120 as illustrated in FIG. 2b, which is a top view for the cross section illustrated in FIG. 2a.

Referring to FIG. 2c, an insulating layer 130 is conformally deposited over the substrate 100. The insulating layer 130 is deposited using conventional techniques. The insulating layer 130 is deposited conformally over the exposed surfaces of the substrate 100. The insulating layer 130 may be deposited by a suitable low temperature process such as plasma enhanced CVD and/or organic vapor phase deposition. Alternatively, the substrate 100 may be exposed to an oxidation process to form the insulating layer 130.

A conductive liner 140 is next deposited over the insulating layer 130. The conductive liner 140 is a seed layer for subsequent metallization in one embodiment. In an alternative embodiment, the conductive liner 140 is a barrier layer to prevent metal atoms from penetrating into the insulating layer 130. The conductive liner 140 is deposited, for example, using a sputtering process.

A first resist layer 150 is deposited and patterned using conventional lithography as illustrated in FIG. 2c. The mask 125 used for patterning the first resist layer 150 is illustrated in FIG. 2d. The mask 125 defines a region for metallization as described further below. Therefore after patterning the first resist layer 150, the regions not within the dashed line (mask 125) have photo resist protecting the insulating layer 130 and the conductive liner 140.

While in the above embodiment, the insulating layer 130 is formed first followed by the deposition of the first resist layer 150, in alternative embodiments, the first resist layer 150 is deposited over the substrate 100 and patterned before depositing the insulating layer 130. In such embodiments, the insulating layer 130 may be deposited selectively in areas exposed (opened) after the patterning of the first resist layer 150. For example, in one embodiment, an oxidation process may be used to selectively deposit the insulating layer 130 after patterning the insulating layer 130. Subsequent processing in this embodiment follows as described below except that steps related to the etching of the insulating layer 130 and the conductive liner 140 are avoided.

Referring next to FIG. 2e, a fill material 160 is deposited and etched so that only a bottom portion of the trench 135 has a fill material 160. In one embodiment, the fill material 160 is coated thereby forming a planar surface over the substrate 100. The fill material 160 is then etched, e.g., using a timed etch, leaving out the bottom portion of the trench 135. The fill material 160 fills in a second trench depth D2 while leaving out a first trench depth D1. In various embodiments, the first and the second trench depths D1 and D2 may be selected such that the metal layers (to be formed) minimize shorting with metal layers from adjacent contacts or other doped regions of the substrate.

In various embodiments, the fill material 160 may comprises a resist material. In alternative embodiments, the fill material 160 comprises a planarizing spin on material including anti-reflective coating materials, materials used for bottom anti-reflective coating materials (BARC). In yet alternative embodiments, the fill material 160 may comprise an oxide such as low temperature oxide. In one embodiment, the fill material 160 is selected to comprise a material that etches easily relative to metal, such as the first metal layer 110 described below.

Referring next to FIG. 2f, a first metal layer 110 is deposited over the conductive liner 140. The first metal layer 110 may be deposited using an electrolytic process using the conductive liner 140 as a seed layer in various embodiments. In various embodiments, the first metal layer 110 is deposited by an electro chemical deposition process.

In one embodiment, the first metal layer 110 is deposited using electroplating. In electroplating, electrical current reduces cations of a desired material from a solution to coat the conductive liner 140 with a thin layer of the first metal layer 110. In electroplating, an ionic metal is supplied with electrons to form a non-ionic coating on a metal layer. A common system may involve a chemical solution with the ionic form of the metal, an anode (positively charged) which may consist of the metal being plated (a soluble anode) or an insoluble anode (usually carbon, platinum, titanium, lead, or steel), and finally, a cathode (negatively charged) where electrons are supplied to produce a film of non-ionic metal.

In an alternative embodiment, the first metal layer 110 may be deposited using an electroless deposition process in which a reducing agent in the chemical solution provides electrons for the reduction reaction, and therefore can be performed without an external current source.

The first metal layer 110 comprises copper or its alloys, although in some embodiments it may comprise nickel (Ni), chromium (Cr), palladium (Pd), gold (Au), cobalt (Co), platinum (Pt), silver (Ag), and combinations thereof or other suitable conductive materials. In some embodiments, a second metal layer (not shown) may be formed over the first metal layer 110. The second metal layer may comprise tin or nickel-phosphorus, and may be deposited using electroplating or electroless techniques. The second metal layer may be subsequently be soldered. In one embodiment, a tin layer may be formed as the second metal layer using electroplating. In another embodiment, a nickel-phosphorus or nickel-molybdenum-phosphorus may be formed as the second metal layer using an electroless deposition process. A protective capping layer, for example, comprising gold, may be formed over the second metal layer.

The fill material 160 is etched and removed after forming the first metal layer 110. Further, the exposed conductive liner 140 from the bottom portion of the trench 135 is also removed using, for example, a wet etch process. In one or more embodiments, the fill material 160 may be removed in a different stage of processing.

Because of the inherent nature of the electrolytic process, the first metal layer 110 is not deposited over the first resist layer 150. Therefore, after depositing the first metal layer 110, the patterned first resist layer 150 can be etched off. The exposed conductive liner 140 and the underlying insulating layer 130 are then etched and removed. In alternative embodiments, the patterned first resist layer 150, the underlying conductive liner 140, and insulating layer 130 are removed in a later stage of processing.

As next illustrated in FIG. 2g, a second resist layer 170 is deposited and patterned. Before depositing the second resist layer 170, a hard mask layer (not shown) may be deposited to provide improved etch resistance during subsequent reactive ion etching.

Next, in one embodiment, the fill material 160 and the exposed conductive liner 140 are removed if not removed in a prior step as described above. As a consequence, after this stage of processing, no metal layer is disposed over the bottom portion of the trench 135. For example, this avoids shorts arising from the first metal layer 110 being coupled to another device region of the substrate 100.

In one or more embodiments, a deep trench 180 is formed as illustrated in FIG. 2h. However, in some embodiments, the deep trench 180 may be skipped and the substrate may be thinned as described in subsequent steps below. The deep trench 180 may be formed using an anisotropic process that etches the exposed substrate 100 through the trench 135. The first metal layer 110 covers a portion of the sidewalls of the trench 135 shadowing the substrate 100. Therefore, the deep trench 180 is aligned to the outer surface of the first metal layer 110 on the trench 135. The deep trench 180 comprises a depth of about 50 μm to about 500 μm, and about 300 μm in one embodiment.

The top view of the structure after forming the deep trench 180 is illustrated in FIG. 2i, while FIG. 2j illustrates an alternate embodiment. Referring to FIG. 2i, the deep trench 180 may be formed having a same length as the trench 135. In such an embodiment, the deep trench 180 extends through the substrate 100 uninterrupted. In contrast, in the embodiment illustrated in FIG. 2j, the deep trench 180 extends beyond the first metal layer 110 by an extension E. In various embodiments, the extension is about 1 μm to about 50 μm, and about 10 μm in one embodiment.

As next illustrated in FIG. 2k, the second resist layer 170 may be removed. The substrate 100 is mounted onto a carrier 195 for handling in preparation of wafer thinning. In FIG. 2k, the carrier 195 encapsulates the first metal layer 110, while in alternate embodiments the carrier 195 may be formed only on the top surface of the first metal layer 110 and/or substrate.

Next, the substrate 100 is thinned from the back side and may be passivated. In one embodiment, the substrate 100 is thinned exposing a lower surface by grinding to a desired thickness. In different embodiments, the thinning may be performed chemically and/or mechanically. For example, in one embodiment, a plasma etch may be used to thin the substrate 100 from the back side. Such techniques have the additional advantage of not damaging the front side.

In various embodiments, the thickness of the substrate 100 after the thinning is about 30 μm to about 500 μm. In one embodiment, the thickness of the substrate 100 after the thinning is about 400 μm. If the deep trench 180 is skipped as described above, the thickness of the substrate 100 after the thinning is about 30 μm to about 100 μm.

Advantageously, the thinning results in separation of the chips on the substrate into individual chips without any dicing. The trench 135 and deep trench 180 (if present) form the sidewall of the chips thus formed.

FIG. 2k illustrates the first chip 101 and the second chip 102 after the thinning while FIG. 2l illustrates the first chip 101 and the second chip 102 after the thinning when the deep trench 180 step was skipped.

The carrier 195 is removed separating the chips. FIG. 2m illustrates individual chips (e.g., first chip 101 and second chip 102) formed using a twin trench process (i.e., the deep trench 180 and trench 135 as described above). FIG. 2n illustrates the first chip 101 and the second chip 102 formed using a single trench process.

FIG. 3, which includes FIGS. 3a-3d, illustrates an alternate embodiment of fabricating a semiconductor device.

Figure 3A:
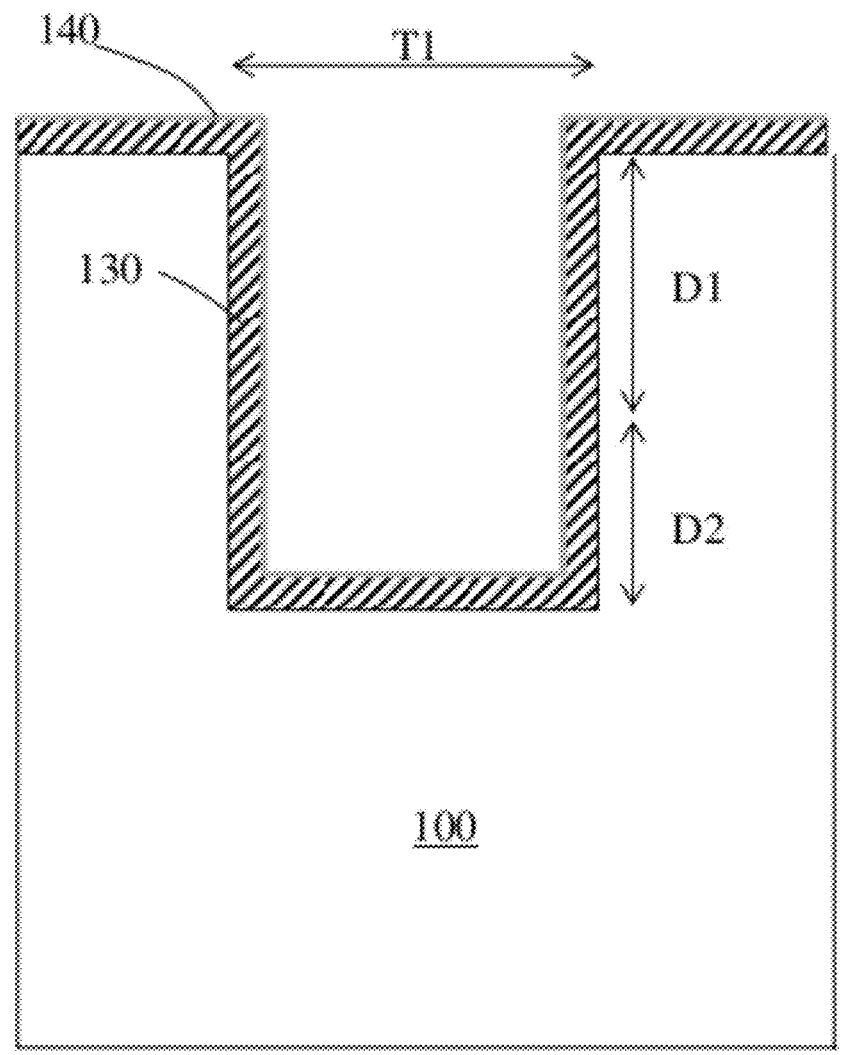
FIGS. 3a-3d, illustrates an alternate embodiment of fabricating a semiconductor device.
Figure 3B:
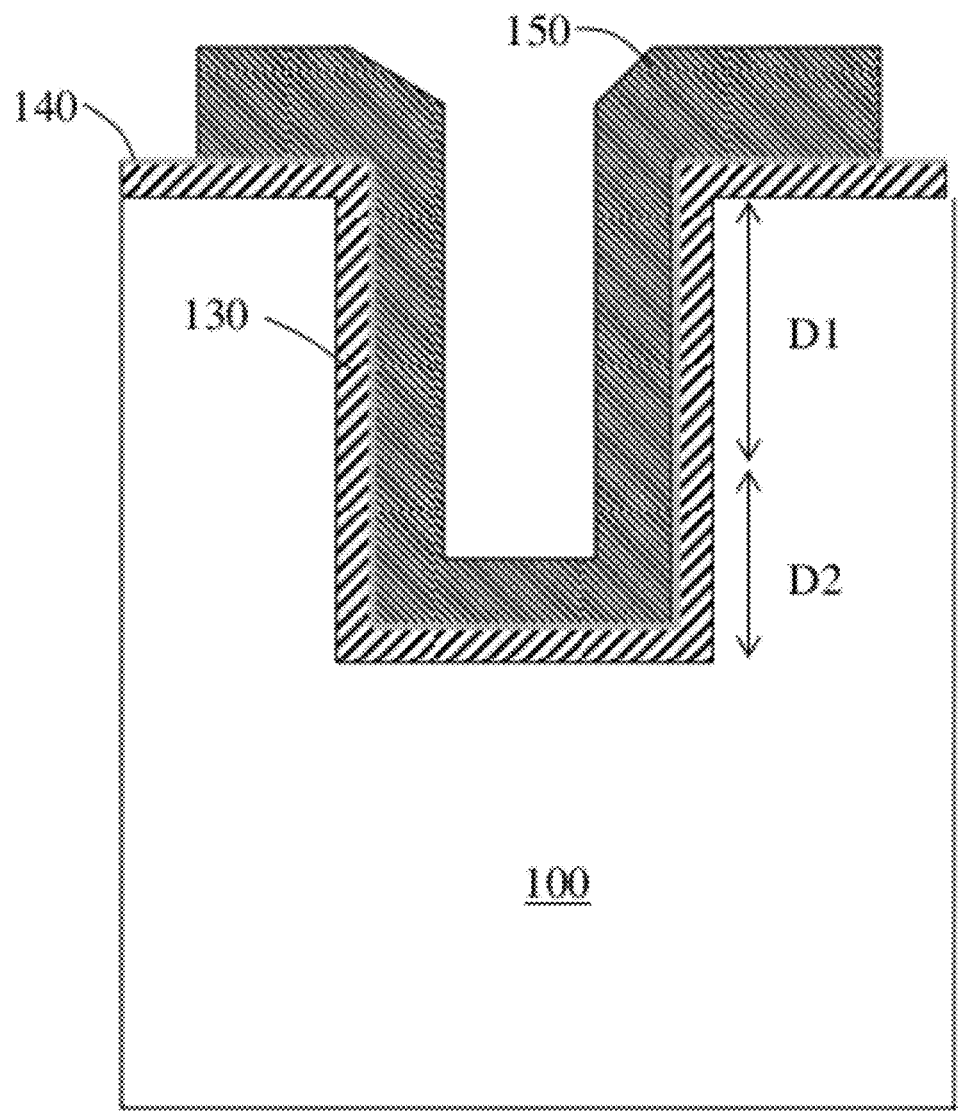

Referring to FIG. 3a, the insulating layer 110 and the conductive liner 140 are formed as described in the prior embodiment. However, as next illustrated in FIG. 3b, a first resist layer 150 is deposited and patterned. In contrast to the prior embodiment, the first resist layer 150 is removed from all regions not forming the contact metallization layer.

Figure 3C:
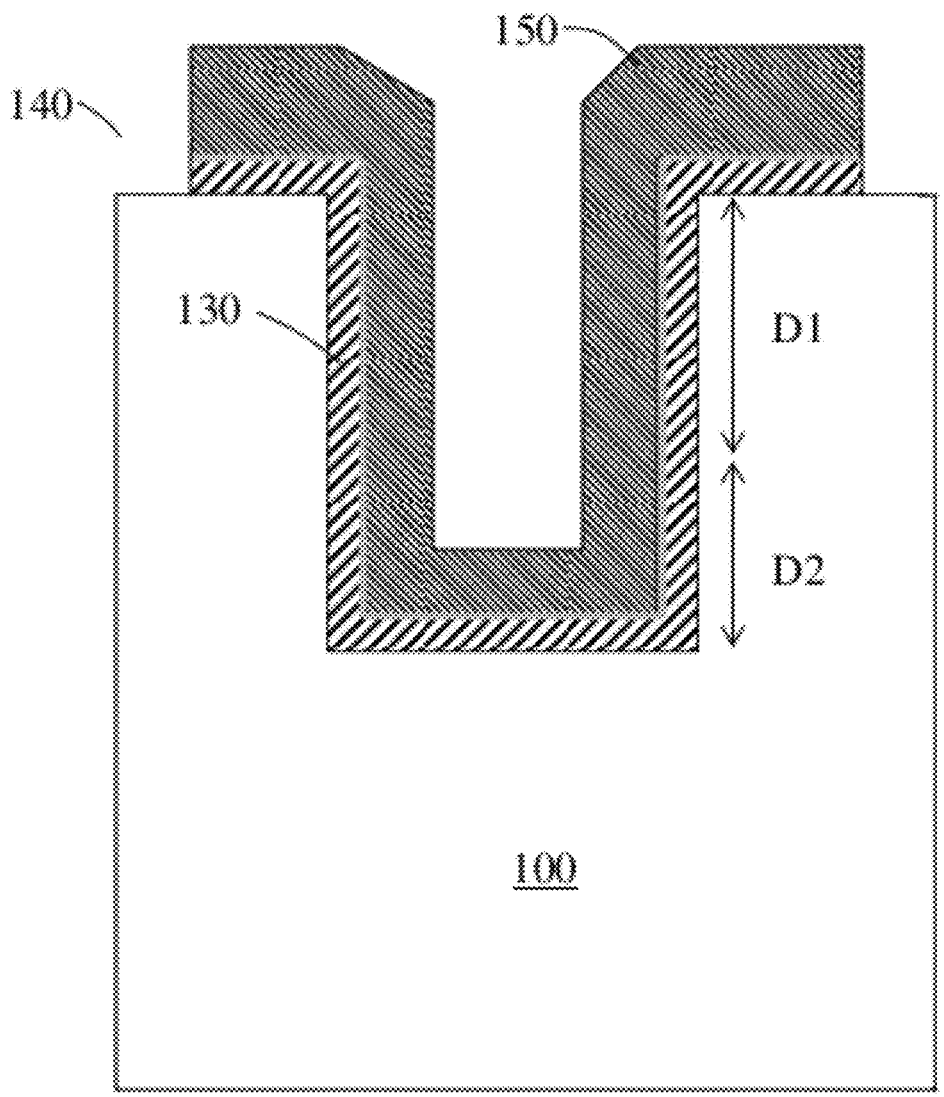

As next illustrated in FIG. 3c, the exposed conductive liner 140 is removed. The exposed insulating layer 110 is next etched off. However, in alternative embodiments, only the conductive liner 140 is removed. The removal of conductive liner 140 is sufficient to prevent metal layers from forming over the exposed insulating layer 110. The insulating layer 110 will not be removed to ensure additional protection against shorting.

Figure 3D:
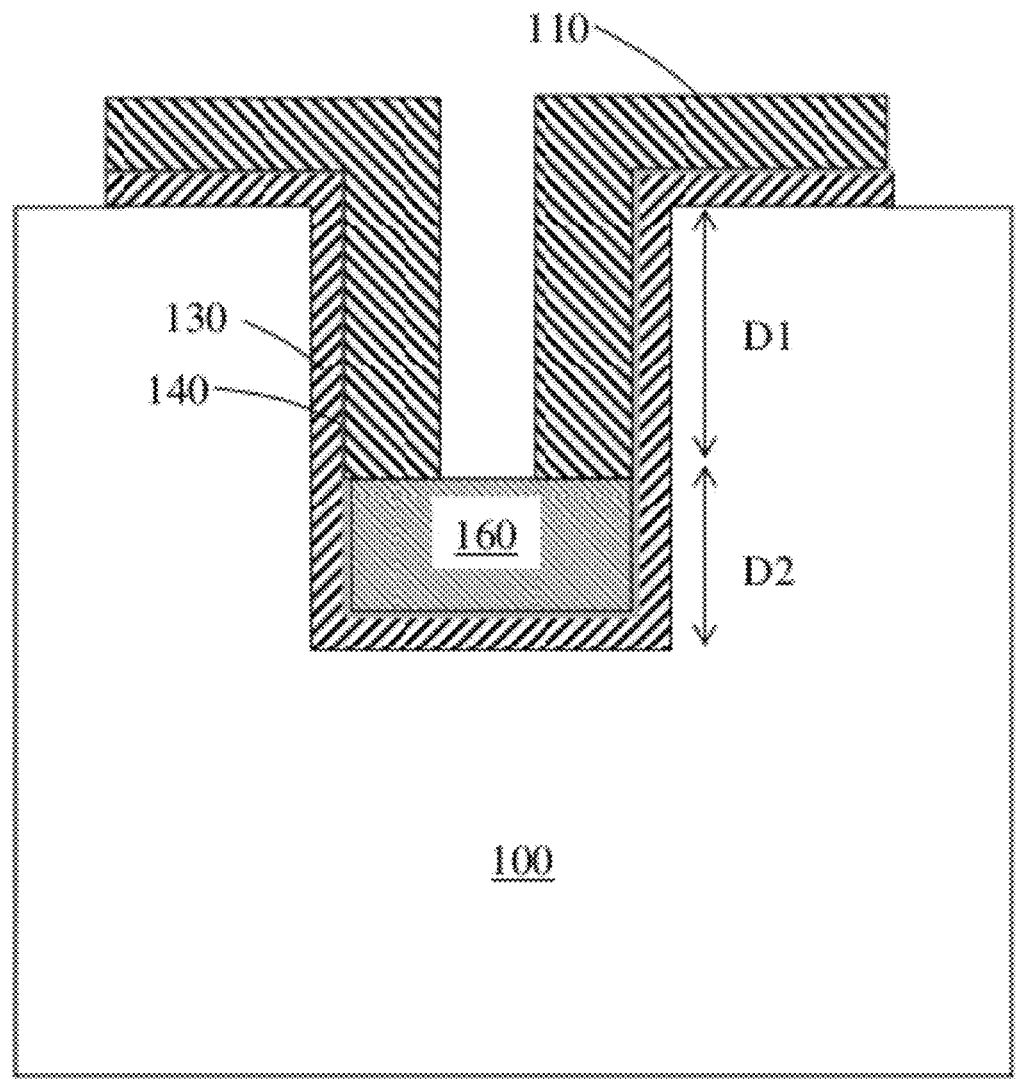

Referring to FIG. 3d, the first resist layer 150 may be removed completely or partially leaving behind some resist within the trench 135. If needed additional resist may be coated and etched to form a fill material 160 as illustrated in FIG. 3d. Subsequent processing continues as described with respect to FIG. 2, for example, by deposition of the first metal layer 110 using an electrolytic process.

Figure 4A:
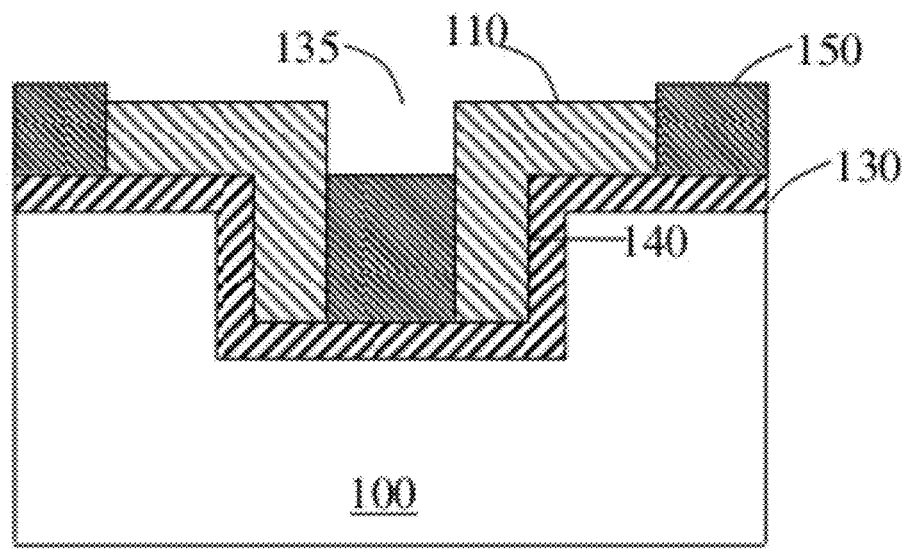
FIGS. 4a and 4b, illustrates an alternate embodiment of fabricating a semiconductor device.
Figure 4B:
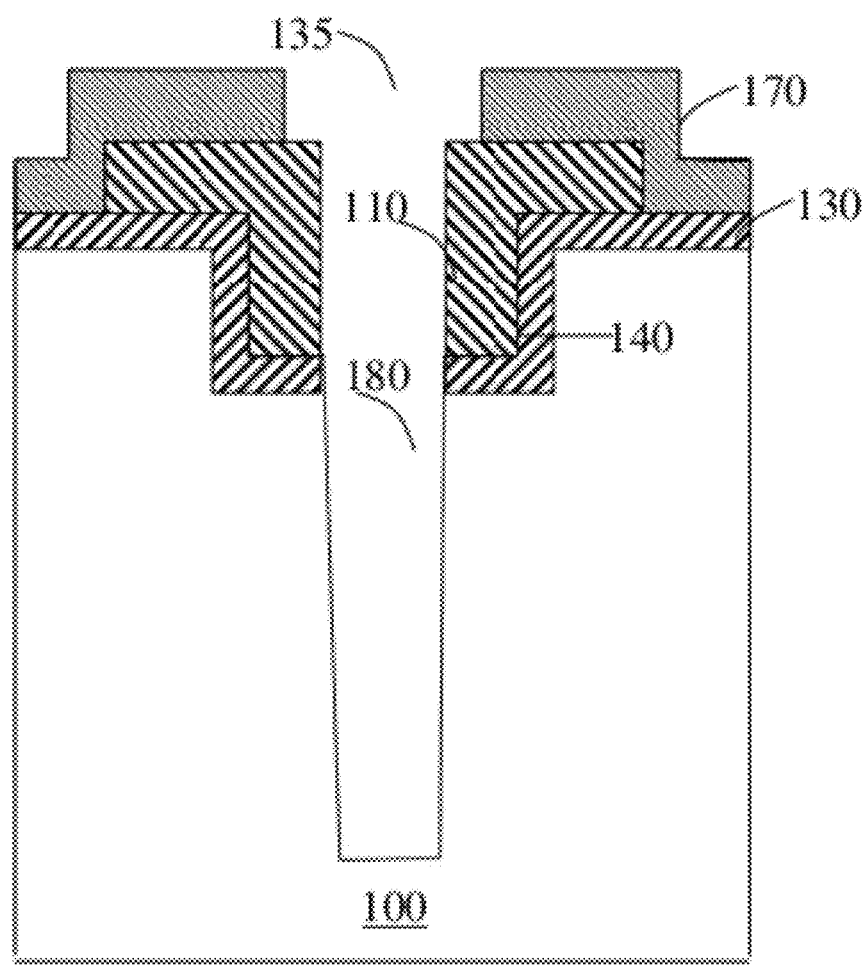

FIG. 4, which includes FIGS. 4a and 4b, illustrates an alternate embodiment of fabricating a semiconductor device.

In this embodiment, the fill material is not used to minimize shorting. Rather, a separate trench is formed after forming the first metal layer 110 as illustrated in FIGS. 4a and 4b.

Referring to FIG. 4a, the trench 135, for example, as shown in FIG. 2a, is formed. An insulating layer 130 is formed over the shallow trench. A conductive liner 140 is formed over the insulating layer 130 as in prior embodiments.

A first resist layer 150 is coated and patterned using lithography. The patterned first resist layer 150 covers at least a central bottom portion of the trench 135. The first metal layer 110 is then deposited using the conductive liner 140 as the seed layer. Therefore no metal is deposited in the central portion of the trench 135.

The first resist layer 150 is removed and a second resist layer 170 is deposited and patterned as illustrated in FIG. 170. The second resist layer 170 may include a hard mask layer. Using the second resist layer 170 as a mask, a deep trench 180 is etched. Subsequent processing proceeds as in prior embodiment.

FIG. 5, which includes FIGS. 5a-5i, illustrates a semiconductor device in various stages of processing in accordance with an embodiment of the invention.

Figure 5A:
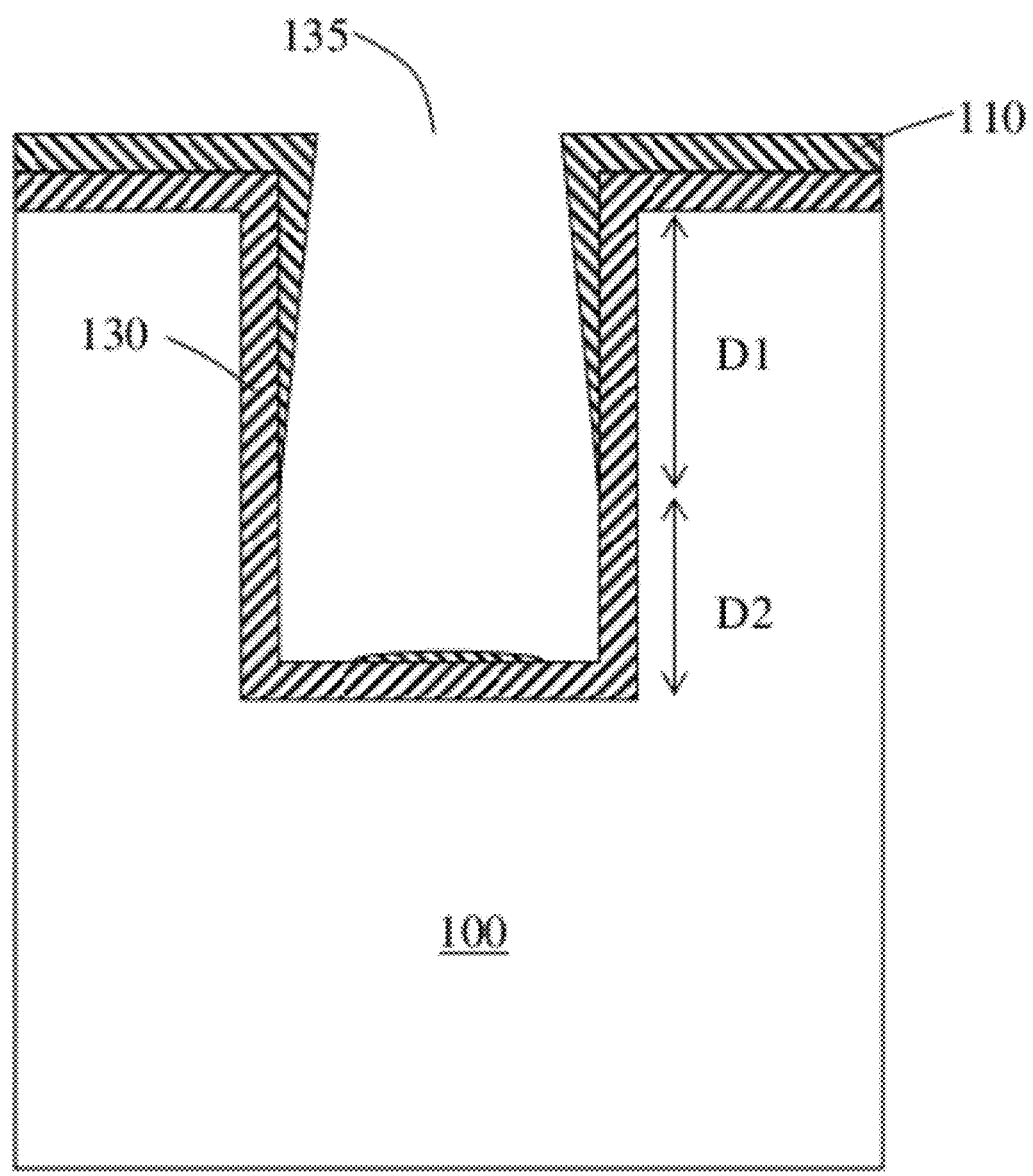
FIGS. 5a-5i, illustrates a semiconductor device in various stages of processing in accordance with an embodiment of the invention.

Referring to FIG. 5a, a trench 135 is formed as in prior embodiments. However, unlike the prior embodiment, the trench 135 in this embodiment is much deeper. In one embodiment, the trench 135 in this embodiment is at least 2× deeper than the trench 135 illustrated in FIG. 2a. In various embodiment, the trench 135 (FIG. 5a) is about 100 μm to about 400 μm, and about 300 μm in one embodiment.

An insulating layer 130 is deposited over the trench 135. The insulating layer 130 is deposited conformally and forms as a liner to the trench 135. The insulating layer 130 also covers the substrate 100.

A first metal layer 110 is formed using an anisotropic deposition. Because of the anisotropic nature of the deposition process, the bottom portion of the sidewalls of the trench 135 is shadowed and the first metal layer 110 does not form in a bottom region of the trench 135. After the anisotropic deposition, the first metal layer 110 has a tapering sidewall having a maximum thickness adjacent the top surface of the substrate 100. Depending on the degree of the anisotropicity, the angle of the taper can be changed. The taper angle of the sidewalls of the first metal layer 110 and the thickness of the deposited metal determine the first and the second trench depths D1 and D2. In various embodiments, the tape angle is nearly vertical and greater than about 85°, and in one embodiment about 89°.

In one or more embodiments, a sputter deposition is used to deposit the metal. Unlike the prior embodiments, an electrolytic process is avoided for forming the first metal layer 110 thereby eliminating the need for a seed layer. In one or more embodiments, the thickness of the deposited metal is about 0.5 μm to about 1.5 μm, and about 0.9 μM in one embodiment.

In one embodiment, after the anisotropic deposition, the first metal layer 110 covers the sidewalls of the trench 135 up to a first trench depth D1, while sidewalls having the second trench depth D2 remain exposed. In various embodiments, the first trench depth D1 is about 40 μm to about 100 μm, and about 60 μm in one embodiment. In various embodiments, the second trench depth D2 is about 100 μm to about 300 μm, and about 200 μm in one embodiment.

In various embodiments, the metal of the first metal layer 110 comprises aluminum, copper, or aluminum-copper alloy.

In other embodiments, the first metal layer 110 comprises other suitable metals such as titanium, gold, tungsten, and combinations thereof or other metallic materials including metal nitrides and silicides including TiN, TaN, WN, TiSi, TaN, and/or WSi.

Figure 5B:
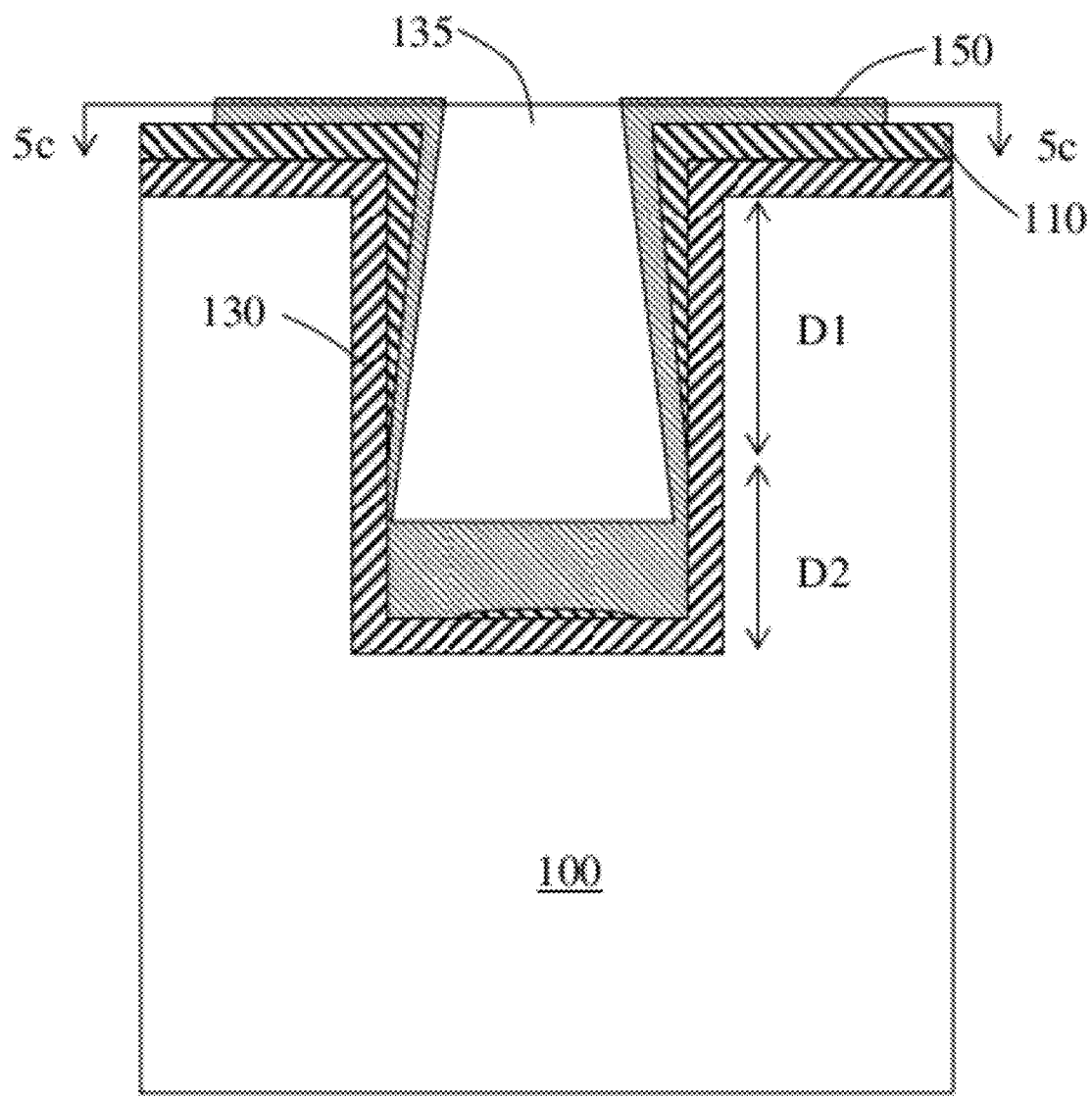
Figure 5C:
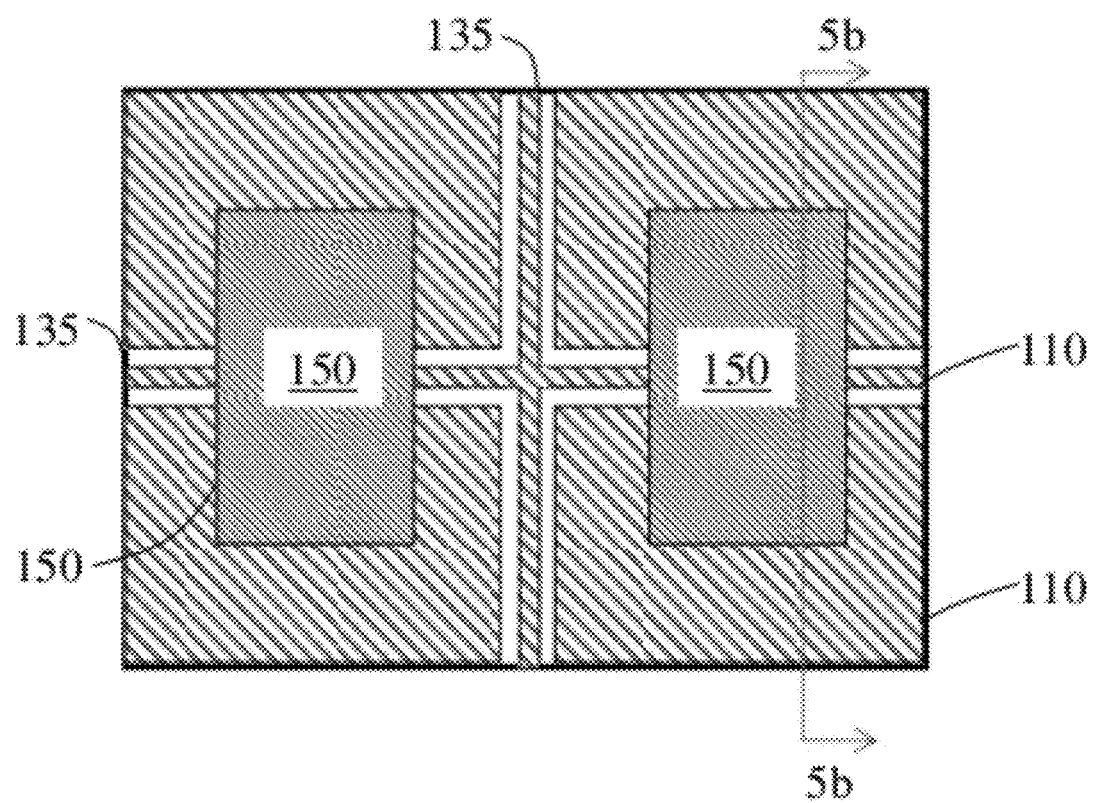

Referring next to FIG. 5b, a first resist layer 150 is deposited and patterned using lithography. Similar to the embodiment described in FIG. 3, the first resist layer 150 is formed over the sidewalls of the trench 135. The first resist layer 150 covers regions of the substrate 100 where the contact metallization will be formed. A top view of the semiconductor device in this stage of processing is illustrated in FIG. 5c.

Figure 5D:
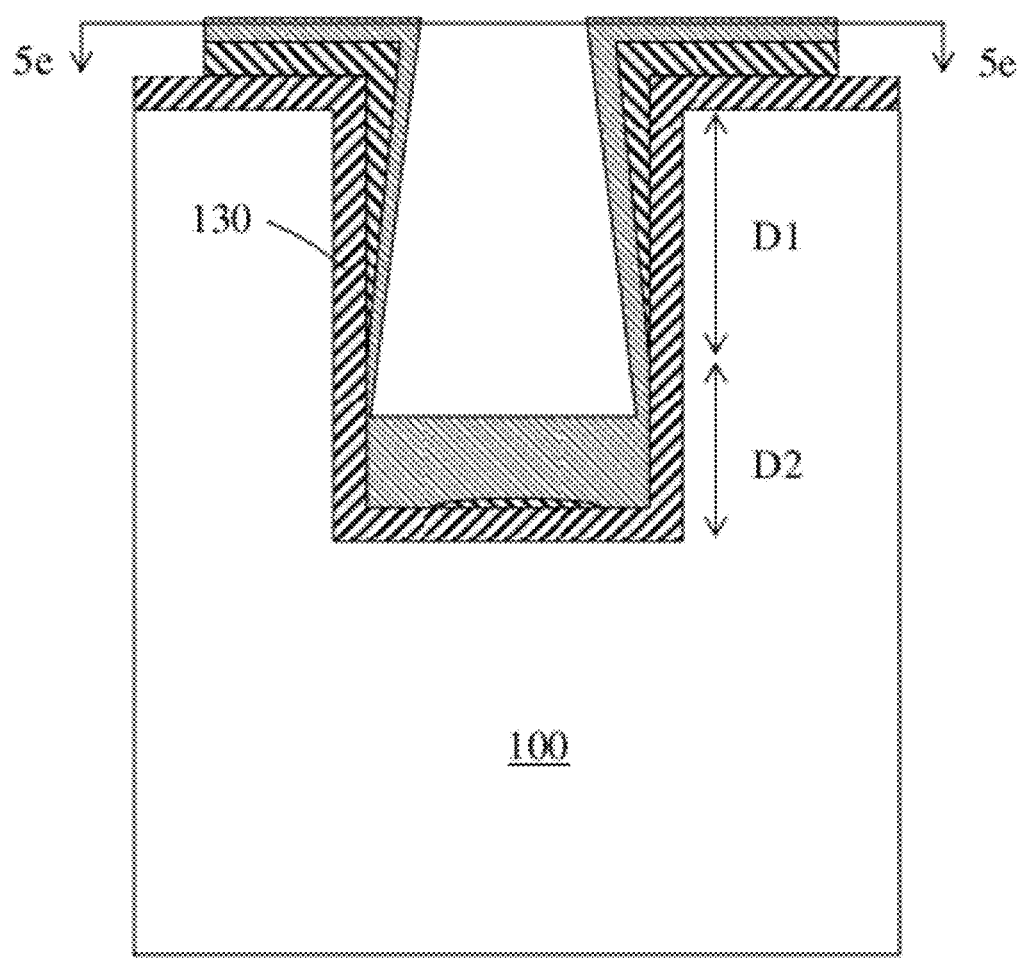
Figure 5E:
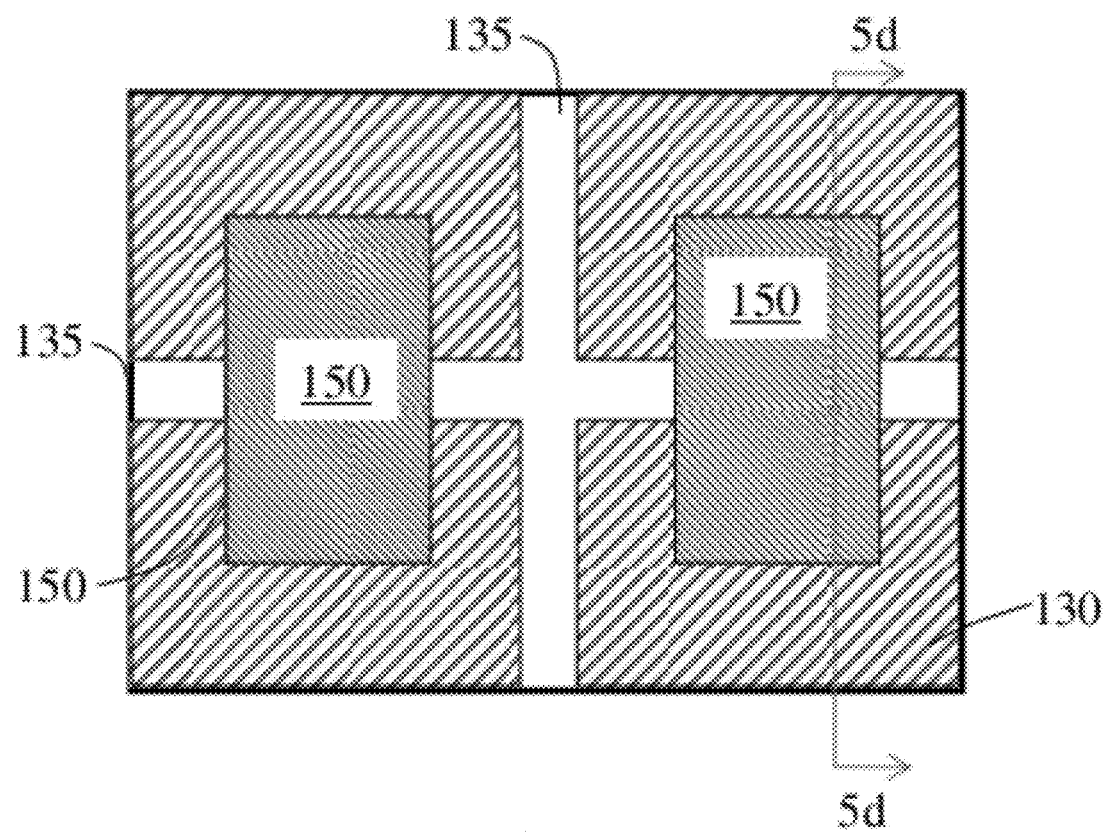

As next illustrated in FIGS. 5d and 5e, the first metal layer 110 that is exposed and not covered by the first resist layer 150 is removed. FIG. 5d illustrates the cross sectional view while FIG. 5e illustrates a top view of the semiconductor device.

Figure 5F:
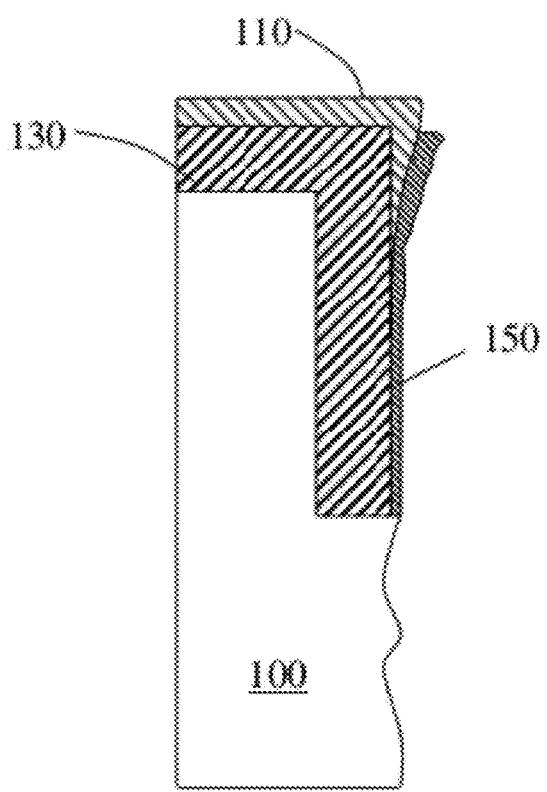
Figure 5G:
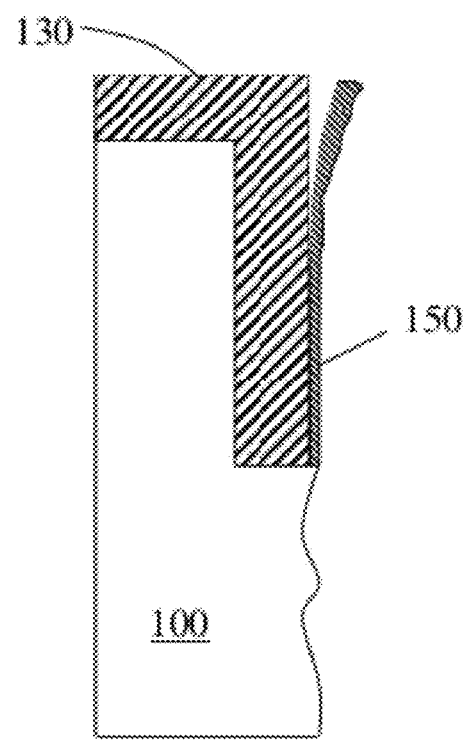

While not illustrated, the first metal layer 110, during the prior deposition, may also have formed over the sidewalls of the chips that may be coupled to different contact pads. While the first resist layer 150 may be developed from the top surface of the substrate 100, some resist may be present over these sidewalls as illustrated in FIG. 5f. In FIG. 5f, the first resist layer 150 is still covering a sidewall. For example, this may be because the top layers of the first resist layer 150 shadow the sidewalls underneath during the lithographic exposure. Hence, the shadowed first resist layer 150 on the sidewalls is not developed. Embodiments of the invention overcome this problem by using an additional wet etch may used to remove metal disposed on sidewalls of the trench 135 that are still covered by the resist layer 150 (as illustrated in FIG. 5g). The wet etch chemistry is selected so as to penetrate under the first resist layer 150. FIG. 5g illustrates the semiconductor device after the wet etching. Alternatively, the etch process of the prior step, described with respect to FIG. 5d, may be tailored to remove the unwanted metal from the sidewalls. Although not described, this additional etching step may also be used in the embodiment described above with respect to FIG. 3.

Figure 5H:
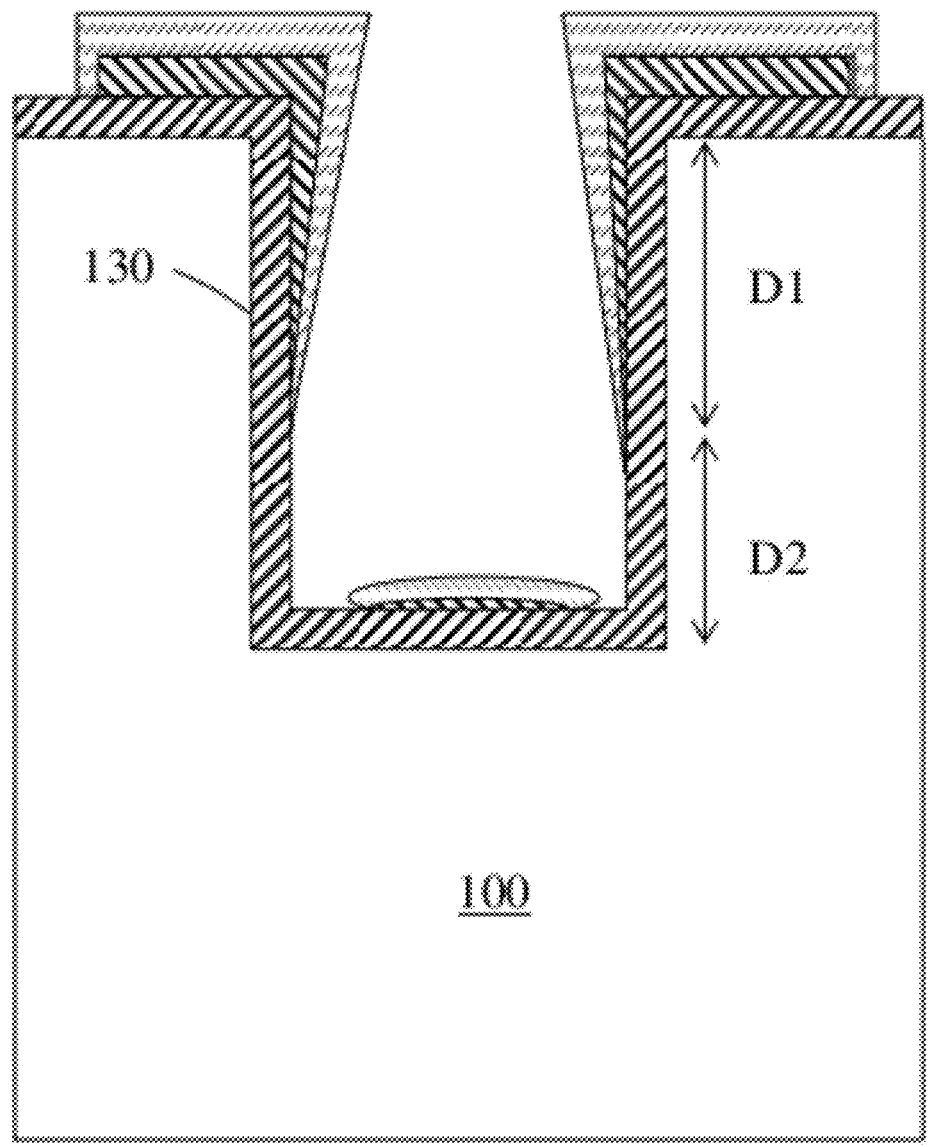

After removing the first resist layer 150, a second metal layer 190 may be deposited using an electrolytic process as illustrated in FIG. 5h, for example, for soldering to external pads. Alternatively, the first resist layer 150 may removed after depositing the second metal layer 190. The second metal layer 190 comprises NiP or NiMoP in one embodiment. In other embodiments, the second metal layer 190 may comprises other suitable conductive materials.

Figure 5I:
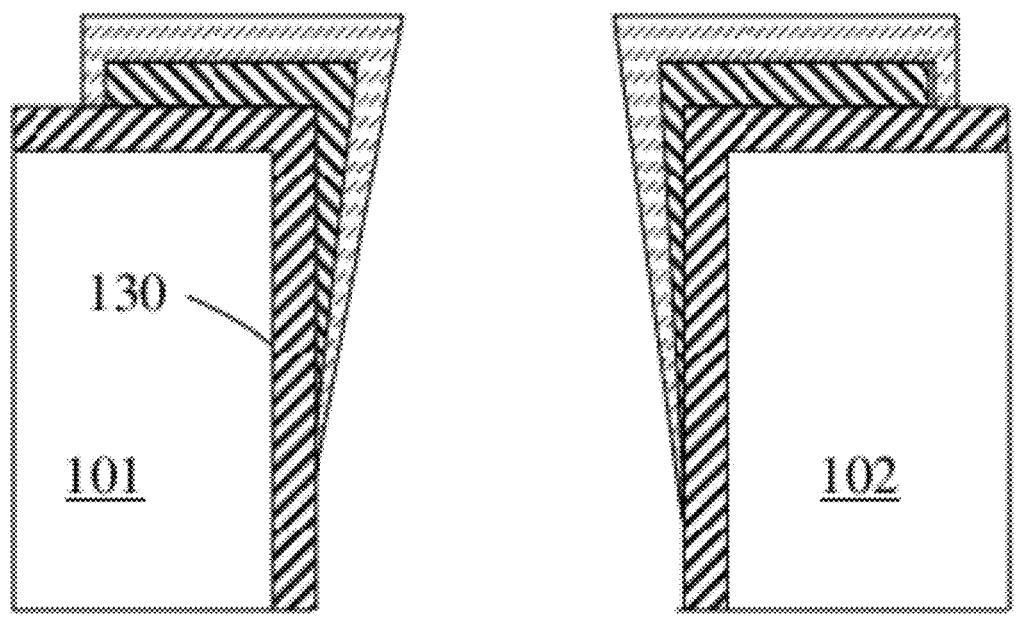

Next, as illustrated in FIG. 5i, the substrate 100 is thinned from the back side after mounting the front side on a carrier (not shown). In one embodiment, the substrate 100 is thinned exposing a lower surface by grinding to a desired thickness. In different embodiments, the thinning may be performed chemically and/or mechanically. The individual chips, such as first chip 101 and second chip 102, are formed after unmounting from the carrier.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
    forming a first trench from a front side of a substrate that has the front side and an opposite back side, the first trench having sidewalls and a bottom surface;
    forming an insulator layer over the sidewalls and the bottom surface of the first trench;
    forming a conductive liner over the insulator layer;
    filling a bottom portion of the first trench with a fill material, the fill material partially filling the first trench such that a portion of the conductive liner over the sidewalls of the first trench remains exposed;
    forming a conductive layer over the exposed conductive liner;
    removing the fill material; and
    separating the substrate along the first trench.

2. The method of claim 1, further comprising:
    forming a second trench in the substrate after removing the fill material, the second trench being formed from the bottom surface of the first trench.

3. The method of claim 1, wherein filling a bottom portion of the trench comprises filling a central region of the bottom portion of the first trench without covering the conductive liner on the sidewalls of the trench.

4. The method of claim 3, further comprising:
    forming a second trench in the substrate after removing the fill material, the second trench being formed from the bottom surface of the first trench.

5. The method of claim 1, wherein filling a bottom portion of the trench comprises covering the sidewalls of the first trench in the bottom portion.

6. The method of claim 1, wherein the substrate is a semiconductor substrate, wherein the insulator layer comprises an oxide or a nitride, wherein the conductive liner comprises copper, tungsten, Ta, TaN, WN, WSi, TiN, and/or Ru, and wherein the conductive layer comprises a metal selected from a group consisting of copper, nickel, chromium, palladium, gold, cobalt, platinum, and silver.

7. The method of claim 1, wherein forming a conductive layer comprises using an electro chemical deposition process.

8. The method of claim 1, wherein separating the substrate comprises thinning the substrate from the back side.

9. The method of claim 1, wherein the fill material is removed from the front side of the substrate.

10. A method of forming a semiconductor device, the method comprising:
    forming a first trench from a front side of a substrate that has the front side and an opposite back side, the first trench having sidewalls extending from a top surface to a bottom surface;
    forming an insulator layer over the sidewalls and the bottom surface of the first trench;
    forming a first conductive layer over a top portion of the sidewalls of the first trench such that the first conductive layer is not formed over a bottom portion of the sidewalls of the first trench, the bottom portion being directly below the top portion; and separating the substrate along the first trench.

11. The method of claim 10, wherein forming a first conductive layer comprises:

forming a conductive liner over the insulating layer;

filling a bottom portion of the trench with a fill material;

forming the first conductive layer over an exposed conductive liner; and removing the fill material.

12. The method of claim 11, wherein filling a bottom portion of the trench comprises filling a central region of the bottom portion of the first trench without covering the conductive liner on the sidewalls of the trench.

13. The method of claim 12, further comprising:

forming a second trench in the substrate after removing the fill material, the second trench being formed from the bottom surface of the first trench, the second trench having a smaller critical dimension than the first trench.

14. The method of claim 11, wherein filling a bottom portion of the first trench comprises covering the sidewalls of the first trench in the bottom portion.

15. The method of claim 10, wherein forming an insulator layer deposits the insulator layer over a top surface of the substrate.

16. The method of claim 15, wherein the insulator layer is formed over an entire top surface of the substrate.

17. The method of claim 15, wherein the insulator layer is selective selectively deposited over a portion of the top surface of the substrate.

18. The method of claim 10, wherein forming a first conductive layer comprises sputtering metal atoms into the first trench, and wherein the sputtering does not form the first conductive layer in a bottom portion of the first trench.

19. The method of claim 10, further comprising forming a second conductive layer over the first conductive layer.

20. The method of claim 19, wherein forming a second conductive layer comprises:

forming a resist layer over the first conductive layer;

patterning the resist layer to expose a portion of the first conductive layer; and removing the exposed portion of the first conductive layer.

21. The method of claim 19, wherein the second conductive layer is formed using an electrochemical deposition.

22. The method of claim 10, wherein separating the substrate comprises thinning the substrate from the back side.

23. The method of claim 10, wherein the first conductive layer is formed having tapered sidewalls using an anisotropic deposition process, wherein the first conductive layer has a maximum thickness adjacent the top surface.

24. A method of forming a semiconductor device, the method comprising:

forming a first trench in a substrate, the substrate having a front side and an opposite back side, the first trench having sidewalls extending from a top surface to a bottom surface;

forming an insulator layer over the sidewalls and the bottom surface of the first trench;

forming a conductive liner over the insulator layer;

forming a first conductive layer over a top portion of the sidewalls of the first trench;

forming a second trench in the substrate from the front side, the second trench extending into the substrate from an opening in a bottom surface of the conductive liner through the bottom surface of the first trench, the second trench having a smaller critical dimension than the first trench; and separating the substrate along the first trench.

25. The method of claim 24, wherein forming a first conductive layer comprises:

filling a bottom portion of the trench with a fill material, the fill material covering a portion of the conductive liner;

forming the first conductive layer over an exposed conductive liner; and removing the fill material.

26. The method of claim 25, filling a bottom portion of the trench comprises filling a central region of the bottom portion of the first trench without covering the sidewalls of the trench.

27. The method of claim 25, filling a bottom portion of the first trench comprises covering the sidewalls of the first trench in the bottom portion.

28. The method of claim 24, wherein forming a first conductive layer comprises sputtering metal atoms into the first trench, wherein the sputtering does not form the first conductive layer in a bottom portion of the first trench.

29. The method of claim 24, forming a second conductive layer comprises:

forming a resist layer over the first conductive layer;

patterning the resist layer to expose a portion of the first conductive layer; and removing the exposed portion of the first conductive layer.

30. The method of claim 24, wherein the first conductive layer is formed having tapered sidewalls using an anisotropic deposition process, wherein the first conductive layer has a maximum thickness adjacent the top surface.

31. The method of claim 24, wherein the second trench is narrower than the first trench.

32. The method of claim 24, separating the substrate along the first trench comprises thinning the substrate up to the bottom surface of the first trench from the back side.

* * * * *

UNITED STATES PATENT AND TRADEMARK OFFICE
CERTIFICATE OF CORRECTION

PATENT NO. : 8,163,629 B2
APPLICATION NO. : 12/851292
DATED : April 24, 2012
INVENTOR(S) : Schuderer et al.

Page 1 of 1

It is certified that error appears in the above-identified patent and that said Letters Patent is hereby corrected as shown below:

In Col. 11, line 30, claim 17, delete "selective".

Signed and Sealed this
Twenty-seventh Day of November, 2012

David J. Kappos
*Director of the United States Patent and Trademark Office*